United States Patent
Kim

(10) Patent No.: US 10,043,953 B2
(45) Date of Patent: Aug. 7, 2018

(54) LIGHT EMITTING DIODE PACKAGE

(71) Applicant: SAMSUNG ELECTRONICS CO., LTD., Suwon-si (KR)

(72) Inventor: Sang Uk Kim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/246,807

(22) Filed: Aug. 25, 2016

(65) Prior Publication Data

US 2017/0186921 A1     Jun. 29, 2017

(30) Foreign Application Priority Data

Dec. 23, 2015  (KR) .................. 10-2015-0185286

(51) Int. Cl.
| | | |
|---|---|---|
| H01L 33/50 | (2010.01) | |
| H01L 33/60 | (2010.01) | |
| H01L 33/54 | (2010.01) | |
| H01L 33/62 | (2010.01) | |
| H01L 33/48 | (2010.01) | |

(52) U.S. Cl.
CPC .......... *H01L 33/504* (2013.01); *H01L 33/505* (2013.01); *H01L 33/508* (2013.01); *H01L 33/60* (2013.01); *H01L 33/486* (2013.01); *H01L 2224/16225* (2013.01)

(58) Field of Classification Search
None
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,747,406 B1 | 6/2004 | Bortscheller et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,953,952 B2 | 10/2005 | Asakawa |
| 6,967,353 B2 | 11/2005 | Suzuki et al. |

(Continued)

FOREIGN PATENT DOCUMENTS

| | | |
|---|---|---|
| CN | 101212015 A | 7/2008 |
| CN | 102800784 A | 11/2012 |

(Continued)

OTHER PUBLICATIONS

Communication dated Jun. 4, 2018, issued by the Chinese Patent Office in counterpart Chinese Application No. 201611114030.0.

*Primary Examiner* — Kimberly Rizkallah
*Assistant Examiner* — Bo Bin Jang
(74) *Attorney, Agent, or Firm* — Sughrue Mion, PLLC

(57) ABSTRACT

A light emitting diode (LED) package includes a package body; an LED chip above the package body; a first wavelength conversion layer containing a first wavelength conversion material, and an upper surface portion covering a part of an upper surface of the LED chip and a lateral portion covering side surfaces of the LED chip; and a second wavelength conversion layer containing a second wavelength conversion material different from the first wavelength conversion material, and covering the first wavelength conversion layer and a remaining part of the upper surface of the LED chip.

18 Claims, 17 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,687,810 B2 | 3/2010 | Mo et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,431,423 B2 | 4/2013 | Basin et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,536,608 B2 | 9/2013 | David et al. |
| 8,729,788 B2 | 5/2014 | Masuda et al. |
| 8,735,931 B2 | 5/2014 | Han et al. |
| 8,766,295 B2 | 7/2014 | Kim |
| 9,081,167 B2 | 7/2015 | Basin et al. |
| 2004/0203312 A1* | 10/2004 | Bortscheller ......... H01L 33/508 445/24 |
| 2005/0127388 A1* | 6/2005 | Lin .................. H01L 33/20 257/99 |
| 2005/0184638 A1 | 8/2005 | Mueller et al. |
| 2008/0211386 A1* | 9/2008 | Choi .................. H01L 33/504 313/503 |
| 2009/0236622 A1* | 9/2009 | Nishihara ............ H01L 33/504 257/98 |
| 2011/0147778 A1* | 6/2011 | Ichikawa ............... H01L 33/50 257/98 |
| 2012/0267647 A1 | 10/2012 | Kim et al. |
| 2012/0299463 A1 | 11/2012 | Kume |
| 2013/0093313 A1* | 4/2013 | Oyamada ............. H01L 33/505 313/503 |

FOREIGN PATENT DOCUMENTS

| | | |
|---|---|---|
| JP | 2003-46136 A | 2/2003 |
| JP | 2015-164234 A | 9/2015 |

\* cited by examiner

LIGHT EMITTING DIODE PACKAGE

CROSS-REFERENCE TO THE RELATED APPLICATION

This application claims priority from Korean Patent Application No. 10-2015-0185286, filed on Dec. 23, 2015, in the Korean Intellectual Property Office, the disclosure of which is incorporated herein in its entirety by reference.

BACKGROUND

Apparatuses and methods consistent with example embodiments of the inventive concept relate to a light emitting diode (LED) package.

LEDs may allow a material included therein to emit light using electric energy, and may convert energy generated by a recombination of electrons and holes of bonded semiconductors into light and emit the light. Such LEDs are being widely used as light sources of lighting devices and display devices, and the development of LEDs is gradually accelerating.

Recently, commercialization of mobile phone keypads, vehicle turn signal lamps, camera flashes, and the like using gallium nitride (GaN)-based LEDs requires general lighting using LEDs to be actively developed. Use of LEDs such as backlight units of large televisions, automobile headlamps, or general lamps is expanding to areas of large, high-output, high-efficiency products, and accordingly, LED chips and the structures of LED packages have been developed to improve light extraction efficiency thereof.

SUMMARY

The example embodiments of the inventive concept may provide a light emitting diode (LED) package that may allow luminous flux thereof to be increased and a color temperature thereof to be easily controlled.

According to an example embodiment, there is provided an LED package which may include: a package body; an LED chip above the package body; a first wavelength conversion layer containing a first wavelength conversion material, and an upper surface portion covering a part of an upper surface of the LED chip and a lateral portion covering side surfaces of the LED chip; and a second wavelength conversion layer containing a second wavelength conversion material different from the first wavelength conversion material, and covering the first wavelength conversion layer and a remaining part of the upper surface of the LED chip.

The lateral portion of the first wavelength conversion layer may have a concavely inclined surface extending outwardly from upper edges of the LED chip to a portion of the package body.

The upper surface portion of the first wavelength conversion layer may cover only two upper vertexes, among a plurality of upper vertexes, of the LED chip opposite to each other in a diagonal direction.

The upper surface portion of the first wavelength conversion layer may cover only two upper edges, among a plurality of upper edges, of the LED chip opposite to each other.

The upper surface portion of the first wavelength conversion layer may have different thicknesses of which the greatest thickness is within a range of 10 μm to 40 μm.

An area of the upper surface portion of the first wavelength conversion layer may be within a range of 85% to 95% of an area of the upper surface of the LED chip.

The first wavelength conversion layer may further include a transparent resin, and an edge part of the lateral portion of the first wavelength conversion layer may include a region including only the transparent resin among the transparent resin and the first wavelength conversion material.

The LED chip may be mounted above the package body in a flip-chip form, and the first wavelength conversion layer may fill a space between a lower surface of the LED chip and the package body.

The LED package may further include a reflective structure disposed above the package body. The reflective structure may be inclined to reflect a light emitted from the second wavelength conversion layer in an upward direction. The lateral portion of the first wavelength conversion layer may have a concavely inclined surface extending outwardly from upper edges of the LED chip to a portion of the package body without contacting the reflective layer.

The LED chip may be configured to emit a blue light. The first wavelength conversion material may contain a red phosphor, and the second wavelength conversion material may contain a green phosphor.

According to an example embodiment, there is provided an LED package which may include: a package body; an LED chip mounted above the package body; a first wavelength conversion layer containing a first wavelength conversion material, covering at least side surfaces of the LED chip, and having a concavely inclined surface extending outwardly from upper edges of the side surfaces of the LED chip to a portion of the package body to cover the side surfaces of the LED chip; and a second wavelength conversion layer containing a second wavelength conversion material different from the first wavelength conversion material, and covering the first wavelength conversion layer, wherein the second wavelength conversion layer contacts the at least a part of an upper surface of the LED chip.

The first wavelength conversion layer may not cover an upper surface of the LED chip, while the second wavelength conversion layer covers the upper surface of the LED chip by contacting an entire portion of the upper surface of the LED chip. Alternatively, the first wavelength conversion layer may cover an entire upper surface of the LED chip. However, the first wavelength conversion layer may cover only a part of an upper surface of the LED chip, while the second wavelength conversion layer covers a remaining part of the upper surface of the LED chip.

According to an example embodiment, there is provided an LED package which may include: a package body; an LED chip mounted above the package body; a first wavelength conversion layer formed by dispensing a first resin containing a first wavelength conversion material over at least a part of an upper surface of the LED chip such that the first resin covers only a part of an upper surface of the LED chip and entire side surfaces of the LED chip; and a second wavelength conversion layer containing a second wavelength conversion material different from the first wavelength conversion material, and covering the first wavelength conversion layer and a remaining part of the upper surface of the LED chip.

The second wavelength conversion layer may be formed by dispensing a second resin containing the second wavelength conversion material over the remaining part of the upper surface of the LED chip and the first wavelength conversion layer. Or, the second wavelength conversion layer may be formed by molding the remaining part of the upper surface of the LED chip and the first wavelength conversion layer using a second resin containing the second wavelength conversion material.

The first wave length conversion layer may be formed by dispensing the first resin over two points of the upper surface of the LED chip opposite to each other in a diagonal direction.

The first wave length conversion layer may include a lateral portion having a concavely inclined surface extending outwardly from upper edges of the LED chip to a portion of the package body.

The first resin may fill a space between a lower surface of the LED chip and the package body.

According to an example embodiment, there is provided a method of manufacturing an LED) package. The method may include: mounting an LED chip above a package body; disposing a first resin containing a first wavelength conversion material over at least a part of an upper surface of the LED chip so that the resin covers only a part of an upper surface of the LED chip and entire side surfaces of the LED chip; disposing a second resin containing a second wavelength conversion material different from the first wavelength conversion material over the first wavelength conversion layer and a remaining part of the upper surface of the LED chip, wherein the disposing the first resin includes dispensing the first resin over the part of the upper surface of the LED chip.

The dispensing the first resin may include dispensing the first resin above two points of the upper surface of the LED chip opposite to each other in a diagonal direction.

The disposing the second resin may include dispensing the second resin over the remaining part of the upper surface of the LED chip and the first wavelength conversion layer. Alternatively, the disposing the second resin may include molding the remaining part of the upper surface of the LED chip and the first wavelength conversion layer using a second resin containing the second wavelength conversion material.

The dispensing the first resin above the two points of the upper surface of the LED chip opposite to each other in a diagonal direction may be performed such that the first wave length conversion layer includes a lateral portion having a concavely inclined surface extending outwardly from upper edges of the LED chip to a portion of the package body.

The dispensing the first resin above the two points of the upper surface of the LED chip opposite to each other in a diagonal direction may be performed such that the first resin fills a space between a lower surface of the LED chip and the package body.

BRIEF DESCRIPTION OF THE DRAWINGS

The above and other aspects, features, and advantages of the example embodiments will be more clearly understood from the following detailed description taken in conjunction with the accompanying drawings, in which.

DETAILED DESCRIPTION

Figure 1:
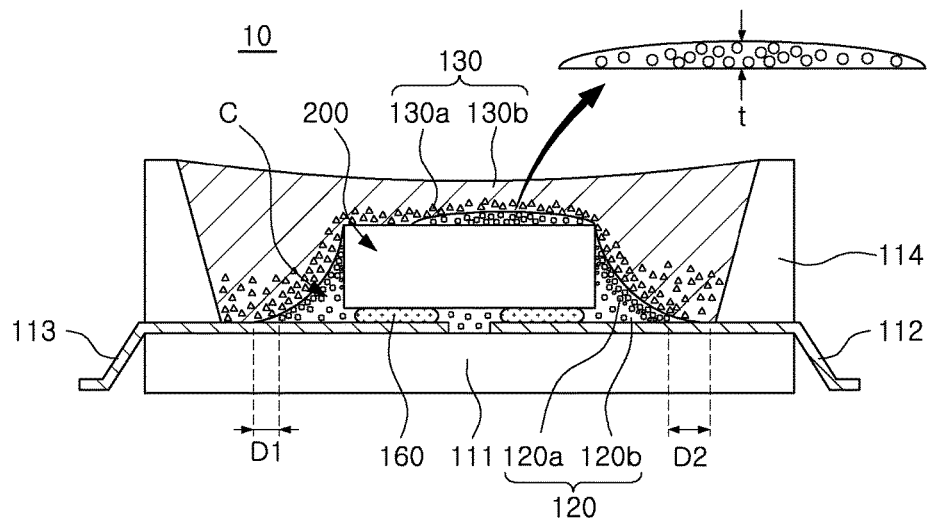
FIG. 1 is a cross-sectional view of a light emitting diode (LED) package according to an example embodiment.

Hereinafter, example embodiments of the inventive concept will be described as follows with reference to the attached drawings.

The inventive concept may, however, be exemplified in many different forms and should not be construed as being limited to the example embodiments set forth herein. Rather, these embodiments are provided such that this disclosure will be thorough and complete, and will fully convey the scope of the inventive concept to those skilled in the art.

Throughout the specification, it will be understood that when an element, such as a layer, region or substrate, is referred to as being "above," "on," "connected to," or "coupled to" another element, it can be directly "above," "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present disclosure. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, example embodiments of the inventive concept will be described with reference to schematic views illustrating embodiments of the present disclosure. In the drawings, for example, due to manufacturing techniques and/or tolerances, modifications of the shape shown may be estimated. Thus, these embodiments of the inventive concept should not be construed as being limited to the particular shapes of regions shown herein, for example, to include a change in shape results in manufacturing. The following embodiments may also be constituted as one or a combination thereof.

The contents of the present disclosure described below may have a variety of configurations and propose only a required configuration herein, but are not limited thereto.

Figure 2:
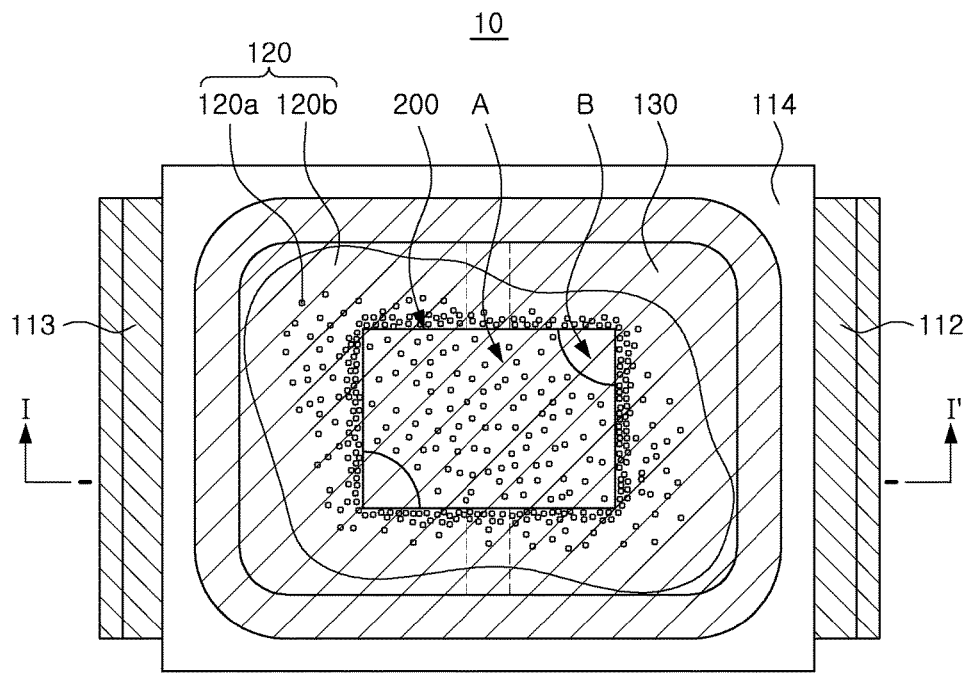
FIG. 2 is a plan view of an LED package according to an example embodiment.

FIG. 1 is a cross-sectional view of a light emitting diode (LED) package according to an example embodiment. FIG. 2 is a plan view of an LED package according to an example embodiment. FIG. 1 is a cross-sectional view taken along line I-I' of FIG. 2.

Referring to FIGS. 1 and 2, an LED package 10 according to an example embodiment may include a package body 111, an LED chip 200 disposed above the package body 111, and a first wavelength conversion layer 120 and a second wavelength conversion layer 130 covering the LED chip 200.

The LED chip 200 may be disposed on a first lead frame 112 and a second lead frame 113 provided on a surface of the package body 111. The LED chip 200 may be electrically connected to the first lead frame 112 and the second lead frame 113 by solder bumps 160. The LED chip 200 may be disposed above the package body 111 in a so-called flip-chip form.

The first wavelength conversion layer 120 may fill a space between a lower surface of the LED chip 200 and the package body 111 formed by the solder bumps 160. Capillarity may allow the first wavelength conversion layer 120 to flow in the space between the lower surface of the LED chip 200 and the package body 111 in a process of forming the first wavelength conversion layer 120 using a dispensing process.

The first wavelength conversion layer 120 may cover a part of an upper surface of the LED chip 200, and side surfaces of the LED chip 200, and the second wavelength conversion layer 130 may cover the first wavelength conversion layer 120 and the remaining part of the upper surface of the LED chip 200.

The first wavelength conversion layer 120 may contain a first wavelength conversion material 120a and a transparent resin 120b, and the second wavelength conversion layer 130 may contain a second wavelength conversion material 130a and a transparent resin 130b. The first and second wavelength conversion materials 120a and 130a may include a phosphor or a quantum dot. Here, the second wavelength conversion material 130a may emit light having a wavelength shorter than a wavelength of the first wavelength conversion material 120a. For example, in a case in which the LED package 10 is to emit white light, the LED chip 200 may emit blue light, the first wavelength conversion material 120a may be a red phosphor, and the second wavelength conversion material 130a may be a green phosphor.

The transparent resins 120b and 130b may have light transmitting characteristics, and include a material selected from the group consisting of a silicone resin, an epoxy resin, a urethane resin, an oxetane resin, an acrylic resin, a polycarbonate resin, a polyimide resin, or combinations thereof. The transparent resin 120b and the transparent resin 130b may include an identical material, but may include different materials, respectively.

As such, the second wavelength conversion layer 130 emitting light having a relatively shorter wavelength than that of the first wavelength conversion layer 120 may be disposed above the first wavelength conversion layer 120, thereby minimizing light emitted from the first wavelength conversion layer 120 to be re-absorbed by the second wavelength conversion layer 130. Therefore, light extraction efficiency of the LED package 10 may be increased.

The first wavelength conversion layer 120 may include an upper surface portion A covering the part of the upper surface of the LED chip 200 and a lateral inclined portion C covering the side surfaces of the LED chip 200.

At least a part of the upper surface portion A may be convex. A thickness t of a thickest portion of the upper surface portion A may be less than or equal to 40 μm, and may be preferably, but not necessarily, within a range of 10 μm to 40 μm. When the thickness t of the thickest portion of the upper surface portion A is more than 40 μm, luminous flux of the LED package 10 may be reduced. When the thickness t of the thickest portion of the upper surface portion A is less than 10 μm, the luminous flux of the LED package 10 may be increased, but a color rendering index (CRI) thereof may be reduced.

An area of the upper surface portion A may be within a range of 85% to 95% of an area of the upper surface of the LED chip 200. In other words, an area of portions B, in which the first wavelength conversion layer 120 is not formed, of the upper surface of the LED chip 200 may be within a range of 5% to 15% of the area of the upper surface of the LED chip 200. Adjustment of the area of the upper surface A may allow the luminous flux and CRI of the LED package 10 to be controlled. According to an example embodiment, the area of the upper surface portion A may be about 90% of the area of the upper surface of the LED chip 200.

Figure 3:
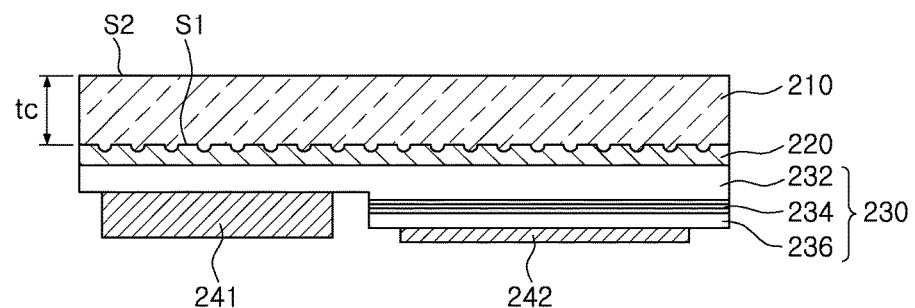
FIG. 3 is a cross-sectional view of an LED employable in the LED package of FIGS. 1 and 2, according to an example embodiment.

The LED chip 200 may be generally hexahedral, and may include four upper vertexes provided by a substrate 210 of FIG. 3. The upper surface portion A may cover two of four upper vertexes opposite to each other in a diagonal direction. The upper surface portion A may allow the remaining portion adjacent to the other two vertexes of the upper surface of the LED chip 200 to be exposed. Thus, exposed portions B of the upper surface of an LED chip 200 as illustrated in FIG. 2 may be disposed to be separated from each other. Here, the exposed portions B are still covered by the second wavelength conversion layer 130. According to an example embodiment, the first wavelength conversion layer 120 may be formed by applying a dispensing operation twice, and a dispensing location may be set as a region adjacent to the two vertexes opposite to each other in the diagonal direction, thereby forming a shape of the upper surface portion A described above to achieve uniform light distribution in a simplified dispensing operation.

Figure 4:
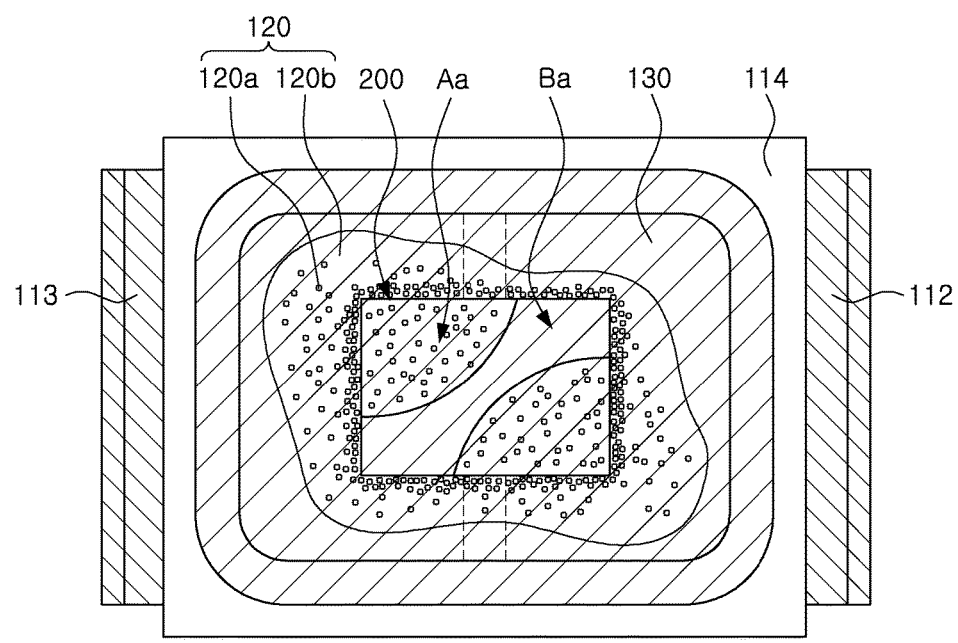
FIGS. 4 through 7 are plan views of LED packages according to example embodiments.

According to an example embodiment, as illustrated in FIG. 4, an upper surface of an LED chip 200 has an exposed portion Ba, formed as a single region, on which a first wavelength conversion layer 120 is not formed. The exposed portion Ba may include two of four upper vertexes of the LED chip 200 which are opposite to each other in a diagonal direction. According to an example embodiment, upper surface portions Aa may be separated from each other to be formed as two regions. This may be implemented by adjusting viscosity of a transparent resin 120b, an amount of the transparent resin 120b coated on the LED chip 200, and the like in an operation of forming the first wavelength conversion layer 120.

The lateral inclined portion C may be disposed to surround the entire four side surfaces of the LED chip 200. The lateral inclined portion C may have a concavely inclined surface extending outwardly from the four side surfaces of the LED chip 200 to the package body 111. A part of the lateral inclined portion C may be disposed on upper surfaces of first and second lead frames 112 and 113 and the remaining part of the lateral inclined portion C may be disposed on an upper surface of a package body 111. The lateral inclined portion C may extend from upper edges of the four side surfaces of the LED chip 200 so that a wavelength of light emitted through the four side surfaces of the LED chip 200 may be efficiently converted. The lateral inclined portion C may also contain a first wavelength conversion material 120a distributed along the concavely inclined surface so that a wavelength of light emitted through the four side surfaces of the LED chip 200 may be efficiently converted.

The concavely inclined surface of the lateral inclined portion C may convert an optical path of lateral light emitted by the LED chip 200 to an upward direction of the LED chip 200 so that a larger amount of light may be irradiated in the upward direction of the LED chip 200.

The LED package 10 according to the present example embodiment may further include a reflective structure 114 disposed above the package body 111. The reflective structure 114 may have an inclined inner side, and may provide a cavity filled with the second wavelength conversion layer 130 covering the LED chip 200.

At least a portion of the lateral inclined portion C of the first wavelength conversion layer 120 may be separated from the reflective structure 114. That is, there exists at least a portion where the first wavelength conversion layer 120 is not disposed above the upper surface of the package body 111. In addition, the LED package 10 may include regions D1 and D2 in which the first wavelength conversion material 120a is not disposed, and for example, which include only the transparent resin 120b, on an edge of the lateral inclined portion C. Such structural features may be provided because the first wavelength conversion layer 120 is formed by dispensing a certain amount of a transparent resin mixed with the first wavelength conversion material 120a and having fluidity.

Here, the package body 111 may be formed of an organic resin material containing epoxy, triazine, silicone, polyimide, and the like, and other organic resin materials, but may include a ceramic material having characteristics such as high heat resistance, excellent heat conductivity, and high reflection efficiency, such as $Al_2O_3$ or AlN, in order to increase heat dissipation characteristics and luminous efficiency. The material of the package body 111 is not limited thereto, and the package body 111 of various materials may be used with consideration of heat dissipation characteristics and electrical connections of the LED package 10.

A related art LED package has been manufactured by mixing a green phosphor and a red phosphor with a transparent resin and applying the mixture to an upper surface and side surfaces of an LED chip emitting blue light in order to emit white light, and the green phosphor and the red phosphor have thus been mixed with each other around the LED chip. Such an LED package structure may cause light emitted by the green phosphor to be absorbed by the red phosphor, and accordingly, light extraction efficiency of the conventional LED package may be decreased.

According to the present example embodiment, the luminous flux of the LED package 10 may be increased by about 2.5%, and the CRI thereof may also be improved by about 2% in comparison to the related art LED package.

FIG. 3 is a cross-sectional view of an LED chip used in an LED package according to an example embodiment.

Referring to FIG. 3, an LED chip 200 may include a substrate 210 having a first surface S1 and a second surface S2 opposite to the first surface S1, a light emitting structure 230 disposed on the first surface S1 of the substrate 210, and a first electrode 241 and a second electrode 242 connected to the light emitting structure 230.

The substrate 210 may be a growth substrate including a material such as sapphire, SiC, Si, $MgAl_2O_4$, MgO, $LiAlO_2$, $LiGaO_2$, or GaN. In this case, the sapphire may allow a thin nitride semiconductor film to be grown thereupon relatively easily and may be stable at high temperatures, and the sapphire may be predominantly utilized as a growth substrate for a nitride semiconductor.

The substrate 210 may have the first and second surfaces S1 and S2 opposite to each other, and at least one of the first and second surfaces S1 and S2 may have an uneven structure formed thereon. The uneven structure may be provided by etching a portion of the substrate 210, and may also be provided by forming a convex portion including a heterogeneous material different from the substrate 210.

As illustrated in FIG. 3, when the uneven structure is formed on the first surface S1 provided as a growth surface of the light emitting structure 230, a high-quality LED package with reduced crystal defects within the light emitting structure 230 may be provided. This may allow internal quantum efficiency to be increased. Because the uneven structure may cause a path of light emitted from an active layer 234 to vary, a rate at which light is absorbed inside of the light emitting structure 230 may be reduced and a light scattering ratio may be increased, and light extraction efficiency may thus be improved.

The light emitting structure 230 may include a first conductive semiconductor layer 232, an active layer 234, and a second conductive semiconductor layer 236 sequentially disposed on the first surface S1 of the substrate 210. For example, the first and second conductive semiconductor layers 232 and 236 may be n- and p-type semiconductor layers, respectively, and may include nitride semiconductors, respectively. The first and second conductive semiconductor layers 232 and 236 may have a composition of $Al_xIn_yGa_{(1-x-y)}N$ (0≤x<1, 0≤y<1, 0≤x+y<1) which corresponds to a material such as GaN, AlGaN, or InGaN for example.

The active layer 234 may be used to emit visible light, and may include an undoped nitride semiconductor layer having a single quantum well (SQW) structure or a multiple quantum well (MQW) structure. For example, the active layer 234 may emit blue light. The active layer 234 may have an MQW structure in which quantum barrier layers and quantum well layers respectively having different compositions satisfying $Al_xIn_yGa_{(1-x-y)}N$ (0≤x<1, 0≤y<1, 0≤x+y<1) are alternately stacked on each other. For example, the active layer 234 may have the MQW structure in which a quantum well layer including InGaN and a quantum barrier layer including GaN are repeatedly stacked. The first and second conductive semiconductor layers 232 and 236 and the active layer 234 may be formed using a process such as metal organic chemical vapor deposition (MOCVD), molecular beam epitaxy (MBE), and hydride vapor phase epitaxy (HVPE) known in the art.

A buffer layer 220 may be disposed between the substrate 210 and the light emitting structure 230. When the light emitting structure 230 is grown on the substrate 210, and for example, a GaN thin film as a light emitting structure is grown on a sapphire substrate, a lattice mismatch of between the sapphire substrate and the GaN thin film may cause a crystal defect such as dislocation, and bending of the sapphire substrate caused by a difference of thermal expansion coefficients between the sapphire substrate and the GaN thin film may cause cracks in the light emitting structure. In order to control such a crystal defect and bending of the sapphire substrate, the buffer layer 220 may be formed on the substrate 210, and a light emitting structure, for example, a nitride semiconductor, may then be grown on the buffer layer 220. The buffer layer 220 may be a low-temperature buffer layer formed at a temperature lower than a single-crystal growth temperature at which the light emitting structure 230 is formed, but is not limited thereto.

The buffer layer 220 may include a material satisfying a composition of $Al_xIn_yGa_{1-x-y}N$ (0≤x≤1, 0≤y≤1), and for example, may be formed of GaN, AlN or AlGaN, or combinations thereof. According to an example embodiment, the buffer layer 220 may be a GaN layer intentionally undoped with an impurity and having a certain thickness.

Since the buffer layer 220 is not limited thereto, any material that may increase crystallinity of the light emitting structure 230 may be employed as the buffer layer 220. For example, a material such as $ZrB_2$, $HfB_2$, ZrN, HfN, TiN, or ZnO may also be used as the buffer layer 220. The buffer layer 220 may also be formed by combining a plurality of layers with different composition or gradually changing a composition thereof.

The first and second electrodes 241 and 242 may be electrically connected to the first and second conductive semiconductor layers 232 and 236, respectively, and may contact the first and second conductive semiconductor layers 232 and 236, respectively.

The first and second electrodes 241 and 242 may have a single layer or a multilayer structure formed of a conductive material having ohmic characteristics with respect to the first and second conductive semiconductor layers 232 and 236.

The first and second electrodes 241 and 242 may include, for example, at least one of materials such as Au, Ag, Cu, Zn, Al, In, Ti, Si, Ge, Sn, Mg, Ta, Cr, W, Ru, Rh, Ir, Ni, Pd, Pt, a transparent conductive oxide (TCO), and the like. The first and second electrodes 241 and 242 both may be disposed on an opposite side of the substrate 210 with respect to the light emitting structure 230, and may be mounted on the first and second lead frames 112 and 113 of the package body 111 in a so-called flip-chip form. In this case, light emitted from the active layer 234 may be externally emitted via the substrate 210.

Figure 5:
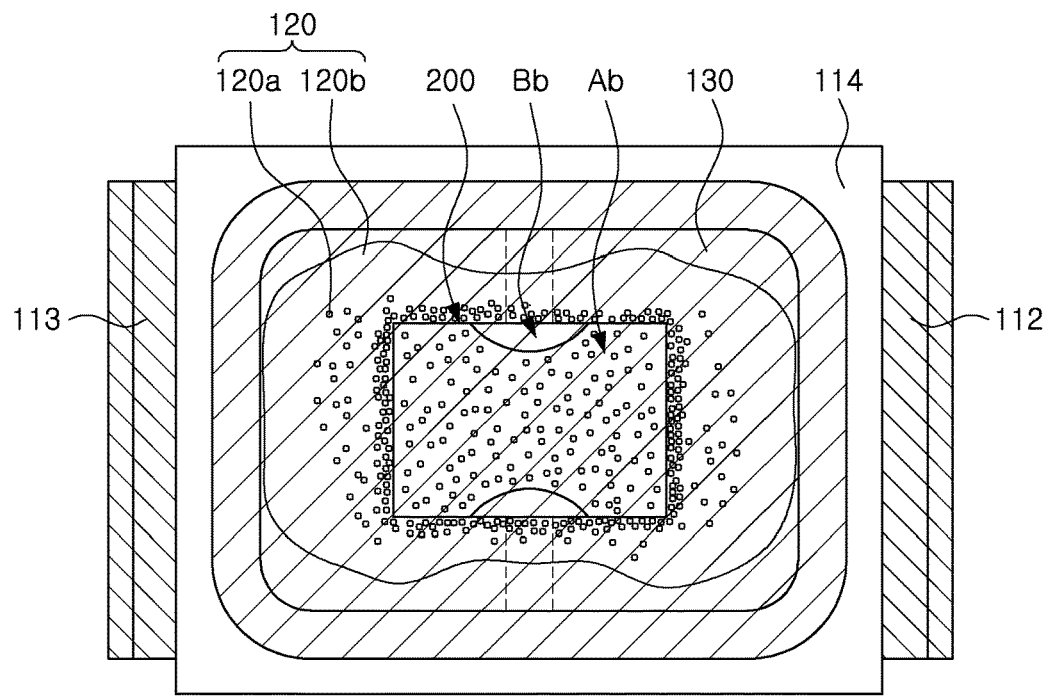
Figure 6:
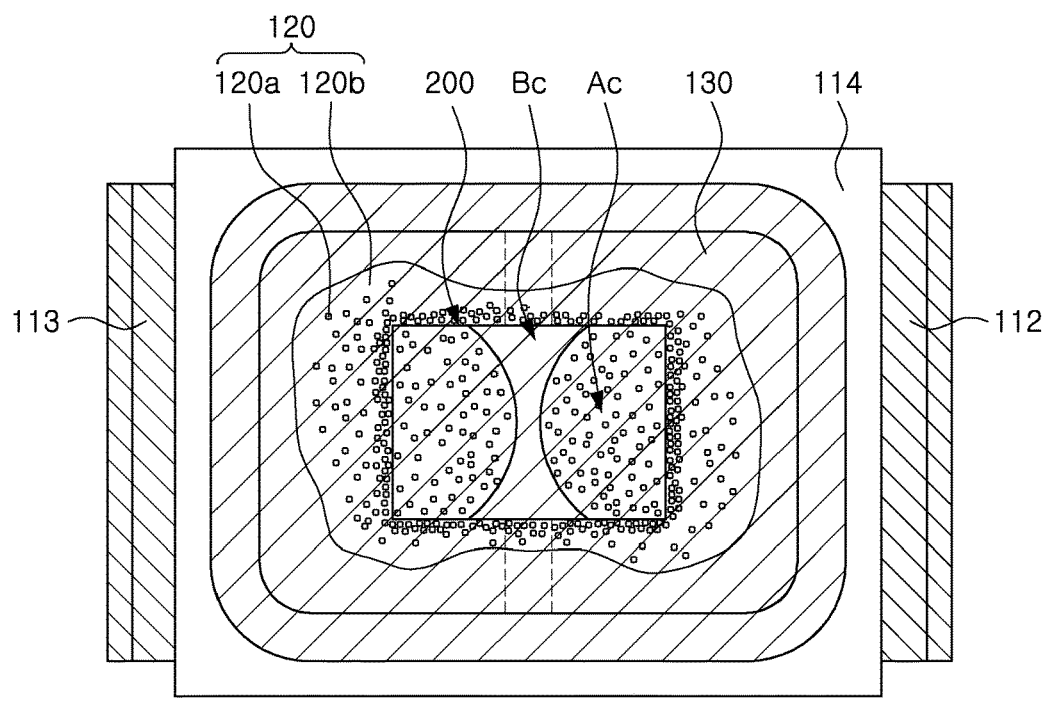

FIGS. 5 and 6 are plan views of LED packages according to example embodiments, respectively.

According to an example embodiment, an upper surface portion of a first wavelength conversion layer 120 formed on an upper surface of an LED chip 200 may have a different shape as compared to the example embodiments described above. The other portions of the LED packages illustrated in FIGS. 5 and 6 are the same or similar to those of the LED packages illustrated in FIGS. 2 and 4, and thus, duplicate descriptions are omitted herebelow in describing the LED packages illustrated in FIGS. 5 and 6.

The LED chip 200 may be generally hexahedral, and thus, may include four upper edges as provided by the substrate 210 of FIG. 3. An upper surface portion Ab may cover two of the four upper edges. The upper surface portion Ab may allow at least portions Bb adjacent to the remaining two edges of the upper surface of the LED chip 200 to be exposed. The exposed portions Bb may be disposed to be separated from each other. Such a shape of the upper surface portion Ab may be changed by shifting a location in which a transparent resin mixed with the first wavelength conversion material is dispensed in a process of forming a first wavelength conversion layer 120. In the present example embodiment, the first wavelength conversion layer 120 may be formed by applying a dispensing operation twice, and a dispensing location may be set as a portion adjacent to the two edges opposite to each other, thereby forming the shape of the upper surface portion Ab described above.

According to an example embodiment, as illustrated in FIG. 6, an exposed portion Bc may be formed as a single region on which a first wavelength conversion layer 120 is not formed. For example, upper surface portions Ac may be separated from each other to be formed as two regions. This may be implemented by adjusting viscosity of a transparent resin 120b, an amount of the transparent resin 120b coated on an LED chip 200, and the like in a process of forming the first wavelength conversion layer 120.

Figure 7:
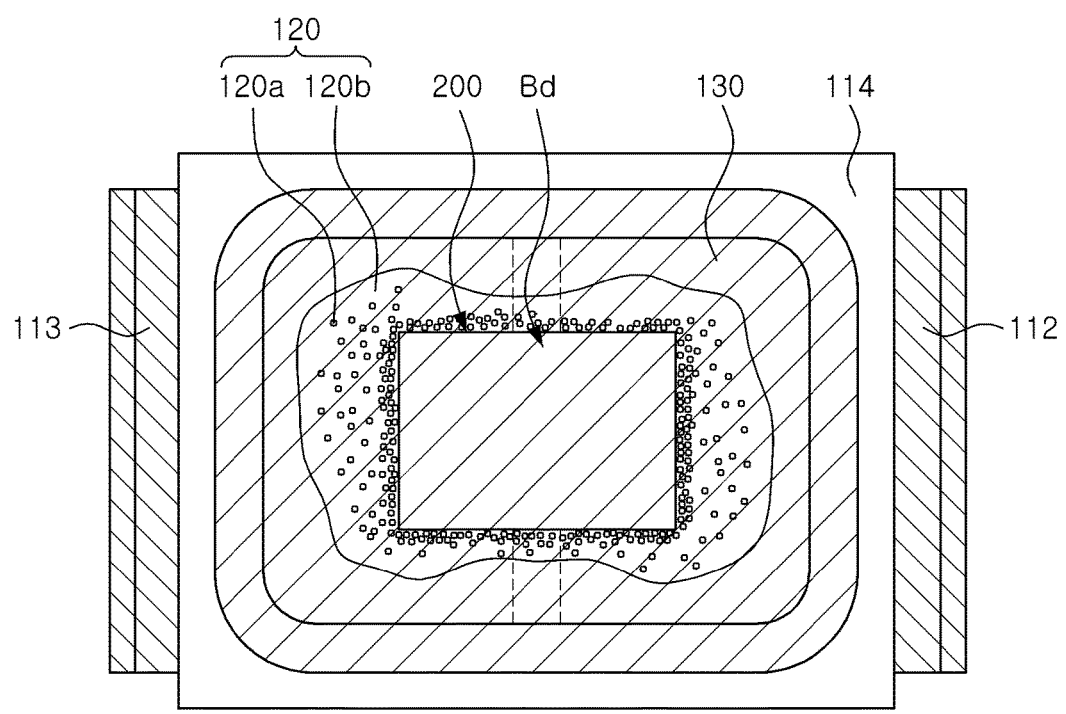

According to an example embodiment, as illustrated in FIG. 7, any region of an upper surface of an LED chip 200 may not be covered by a first wavelength conversion layer 120, and thus, an LED package of this example embodiment may not have the upper surface portion Aa, Ab or Ac illustrated in FIGS. 4-6, respectively, and instead may have only an exposed portion Bd on the upper surface of the LED chip 200. However, a lateral inclined portion C of the first wavelength conversion layer as illustrated in FIG. 1 may still cover side surfaces of the LED chip 200. Further, a second wavelength conversion layer 130 may still be disposed on the upper surface of the LED chip 200.

Figure 8:
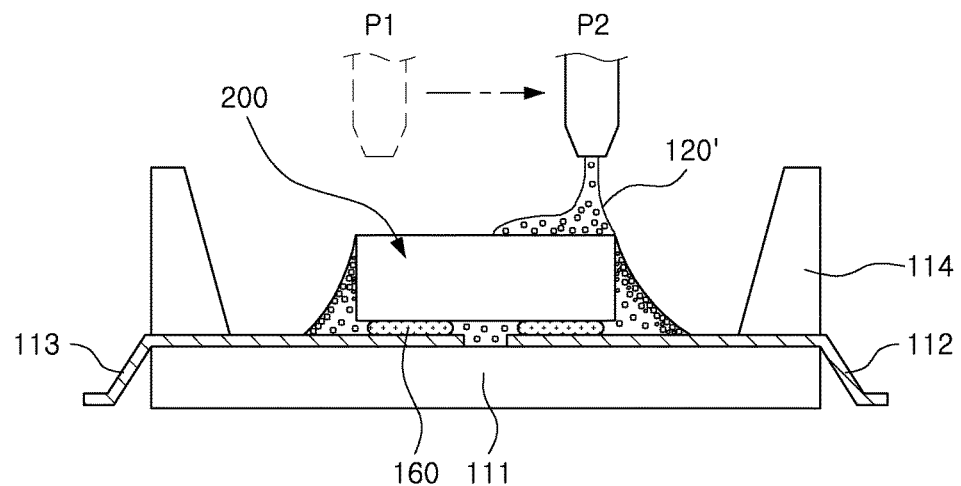
FIGS. 8 through 13 are views illustrating a method of manufacturing the LED package of FIGS. 1 and 2, according to example embodiments.

Next, referring to FIGS. 8 through 13, a method of manufacturing the LED package 10 illustrated in FIGS. 1 and 2 will be described. FIGS. 8, 10, and 12 are cross-sectional views taken along lines I-I' of FIGS. 9, 11, and 13, respectively.

Figure 9:
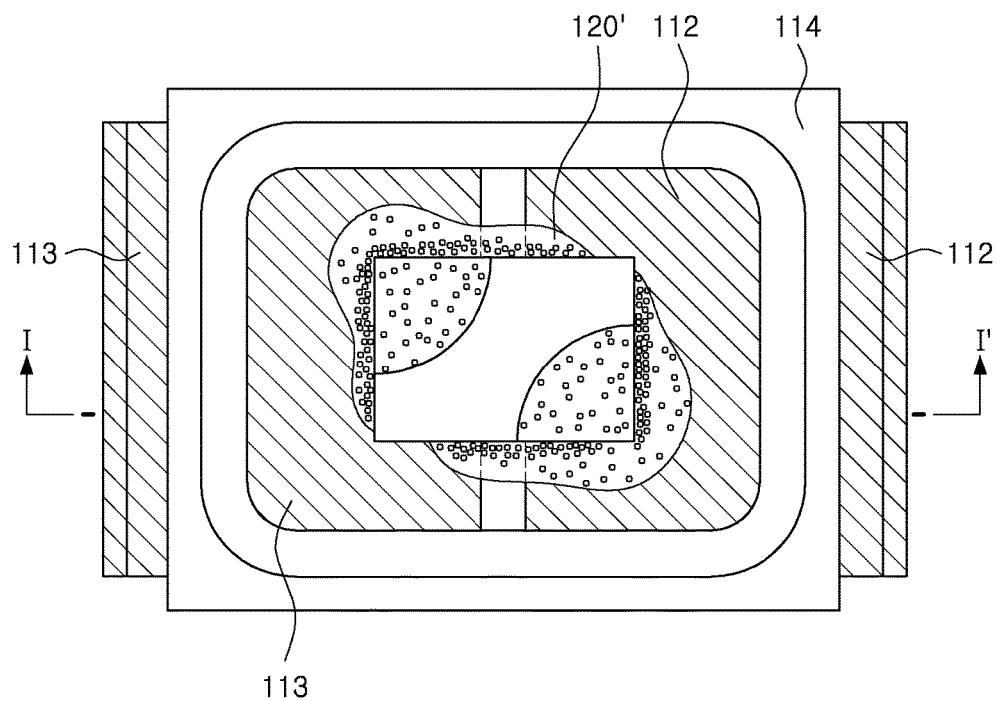
Figure 10:
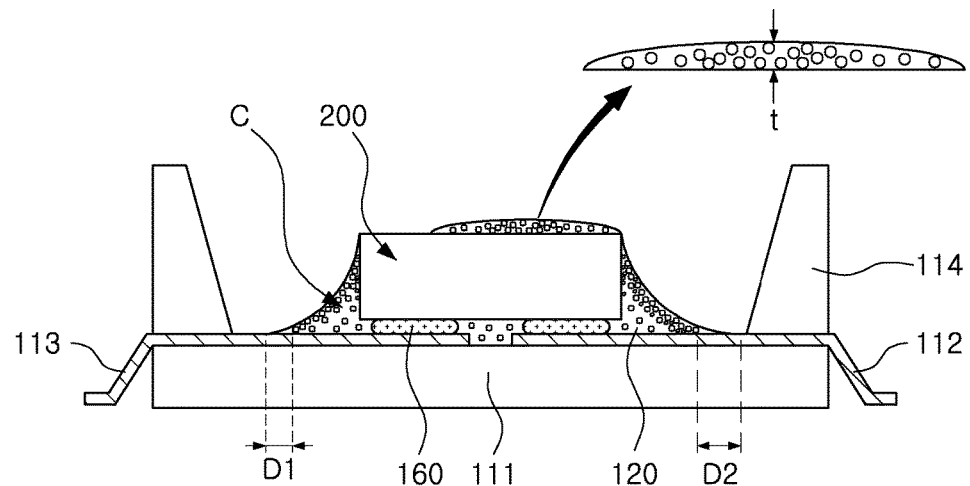

First, as illustrated in FIGS. 8 and 9, an LED chip 200 may be mounted above a package body 111 having a surface on which a first lead frame 112 and a second lead frame 113 are formed. When the LED chip 200 is mounted in a flip-chip form, the LED chip 200 may be mounted using solder bumps 160.

Next, a first wavelength conversion resin 120' may be coated at a first point P1 of an upper surface of the LED chip 200 by using a dispenser, and the first wavelength conversion resin 120' may be coated at a second point P2 of the upper surface of the LED chip 200 by using the dispenser. The first and second point P1 and P2 may be regions adjacent to two of four vertexes of the upper surface of the LED chip 200 opposite to each other in a diagonal direction, respectively. The first wavelength conversion resin 120' may be a mixture of a first wavelength conversion material and a transparent resin having fluidity. For example, the first wavelength conversion material may be a red phosphor, and the transparent resin may be a silicone resin.

A portion of the first wavelength conversion resin 120' may cover a part of the upper surface of the LED chip 200, and the remaining portion thereof may cover side surfaces of the LED chip 200. At this time, a space between a lower surface of the LED chip 200 and the package body 111 may be filled with the first wavelength conversion resin 120' by capillarity. The first wavelength conversion resin 120' covering the part of the upper surface of the LED chip 200 may be convex, and may be divided into two regions. The first wavelength conversion resin 120' covering the side surfaces of the LED chip 200 may have a concavely inclined surface extending outwardly from portions of the side surfaces of the LED chip 200 to a portion of the package body 111.

Figure 11:
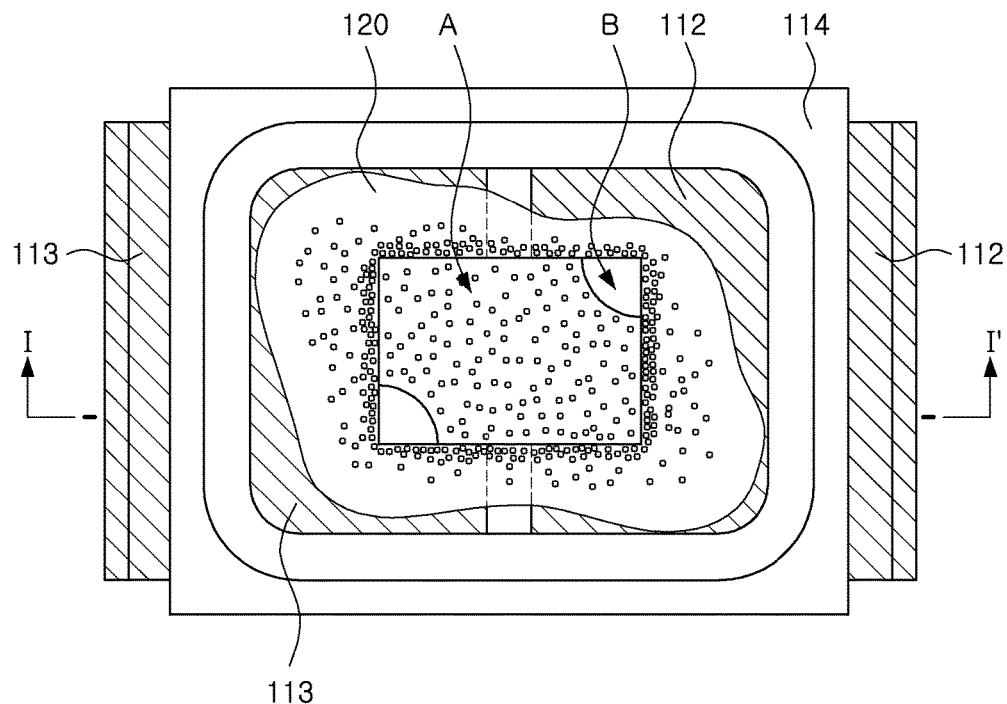
Figure 12:
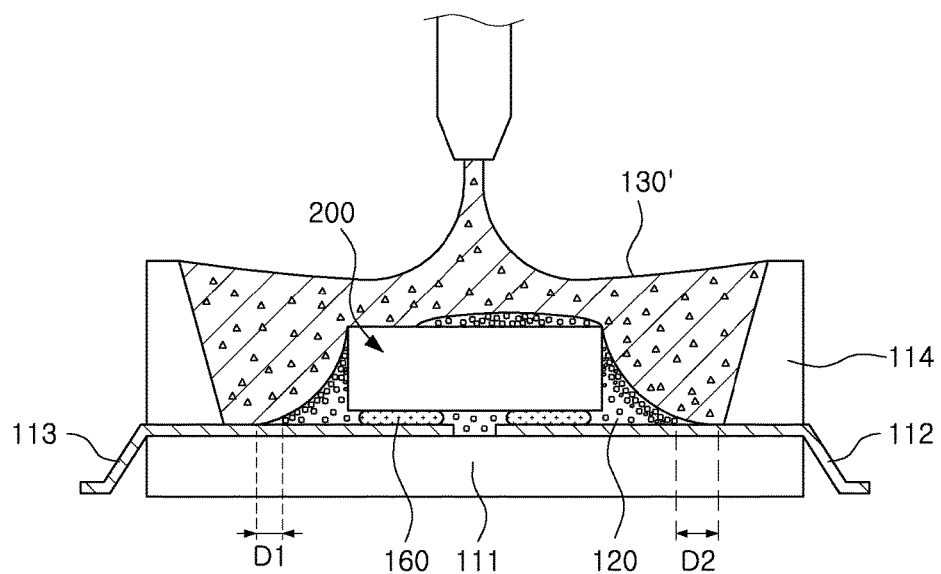

Next, as illustrated in FIGS. 10 and 11, the first wavelength conversion resin 120' may be hardened after a certain period of time passes so that the first wavelength conversion resin 120' may fully spread, and a first wavelength conversion layer 120 may be formed.

The first wavelength conversion layer 120 may have an upper surface portion A, which allows portions B, in which the first wavelength conversion resin 120' is not dispensed and which are adjacent to the remaining two vertexes of the upper surface of the LED chip 200, to be exposed, and may have a lateral inclined portion C covering the four side surfaces of the LED chip 200.

Figure 13:
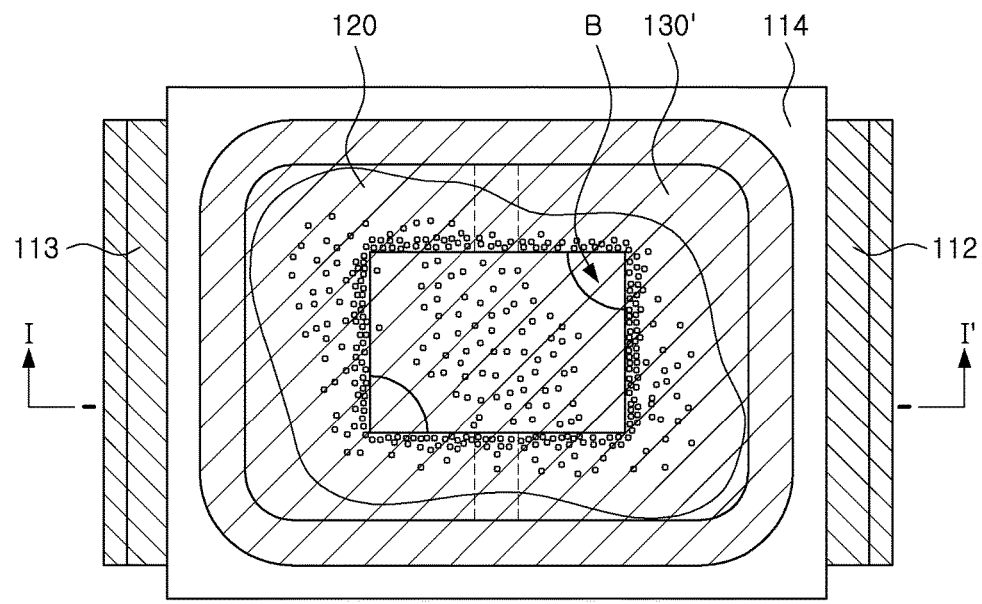

Next, as illustrated in FIGS. 12 and 13, a second wavelength conversion resin 130' may be coated on the first wavelength conversion layer 120 and the upper surface of the LED chip 200 using the dispenser. The second wavelength conversion resin 130' may be a mixture of a second wavelength conversion material and a transparent resin having fluidity. For example, the second wavelength conversion material may be a green phosphor, and the transparent resin may be a silicone resin.

An amount of the coated second wavelength conversion resin 130' may be enough to fill the cavity provided by the reflective structure 114 on the package body 111.

Next, a second wavelength conversion layer 130 may be formed by hardening the second wavelength conversion resin 130'.

This may allow the LED package 10 illustrated in FIGS. 1 and 2 to be manufactured.

Figure 14:
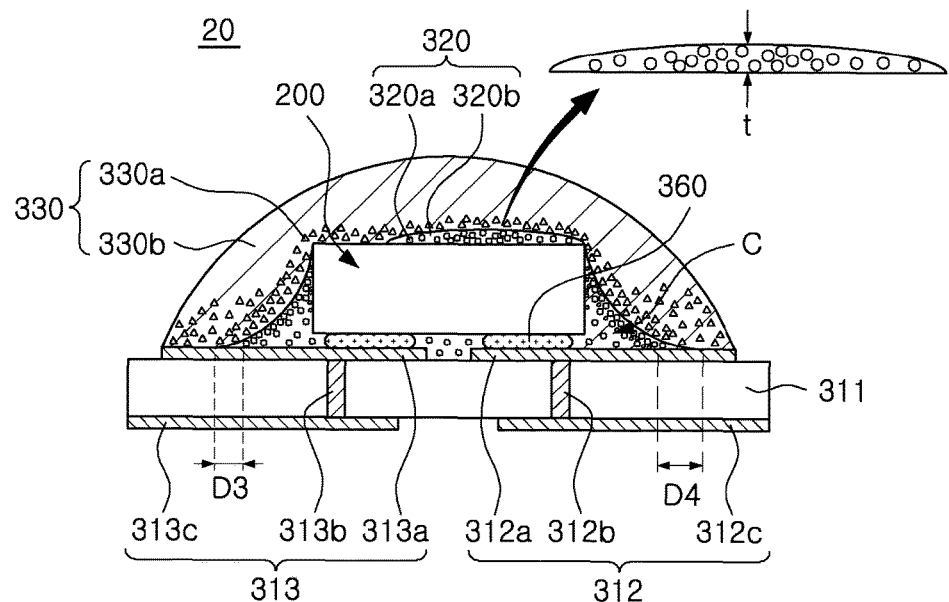
FIG. 14 is a side section view of an LED package according to an example embodiment.
Figure 15:
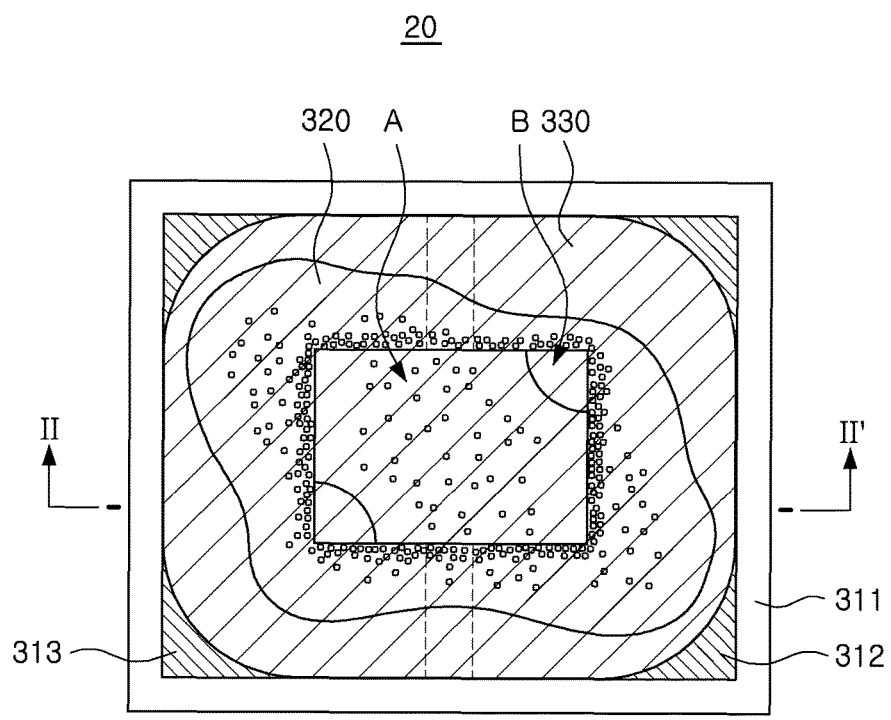
FIG. 15 is a plan view of an LED package according to an example embodiment.

FIG. 14 is a side section view of an LED package according to an example embodiment. FIG. 15 is a plan view of an LED package according to an example embodiment. FIG. 14 corresponds to a cross-sectional view taken along line II-II' of FIG. 15.

An LED package 20 according to the example embodiment differs in that an LED chip 200 is mounted on a package substrate 311 having no reflective structure in comparison to the LED package 10 described above with reference to FIGS. 1 and 2.

Referring to FIGS. 14 and 15, a package substrate 311 may have a first wiring electrode 312 and a second wiring electrode 313. The first wiring electrode 312 may include a first upper electrode 312a disposed on an upper surface of the package substrate 311, a first lower electrode 312c disposed on a lower surface of the package substrate 311, and a first through electrode 312b connecting the first upper electrode 312a to the first lower electrode 312c. The second wiring electrode 313 may include a second upper electrode 313a disposed on the upper surface of the package substrate 311, a second lower electrode 313c disposed on the lower surface of the package substrate 311, and a second through electrode 313b connecting the first upper electrode 313a to the first lower electrode 312c. The package substrate 311 used in the present example embodiment is only an example, and may be applied in various forms. For example, the package substrate 311 may be provided as a printed circuit board (PCB) such as a metal core printed circuit board (MCPCB), a metal printed circuit board (MPCB), or a flexible printed circuit board (FPCB), or a ceramic substrate such as an AlN or $Al_2O_3$ substrate.

The LED chip 200 may be mounted on the first and second wiring electrodes 312 and 313 of the package substrate 311 using solder bumps 360 in a flip-chip form.

A first wavelength conversion layer 320 may have an upper surface portion A and a lateral inclined portion C similar to those of FIGS. 1 and 2. The lateral inclined portion C may have a concavely inclined surface outwardly extending from portions of side surfaces of the LED chip 200 to portions of upper surfaces of the first and second wiring electrodes 312 and 313. The first wavelength conversion layer 320 may contain a first wavelength conversion material 320a and a transparent resin 320b, and for example, the first wavelength conversion material 320a may be a red phosphor, and the transparent resin 320b may be a silicone resin.

A second wavelength conversion layer 330 covering the first wavelength conversion layer 320 and a part of an upper surface of the LED chip 200 may contain a second wavelength conversion material 330a and a transparent resin 330b, and may be disposed on a part of the first electrode 312a and a part of the second upper electrode 313a to be convex. The second wavelength conversion material 330a may be a green phosphor, and the transparent resin 330b may be a silicone resin.

Referring to FIG. 14, the second wavelength conversion layer 330 may be disposed by molding the first wavelength conversion layer 320 and the part of the upper surface of the LED chip 200, according to an example embodiment.

The LED package 20 may include regions D3 and D4 in which the first wavelength conversion material 320a is not dispensed, and for example, which include only the transparent resin 320b, on an edge of the lateral inclined portion C of the first wavelength conversion layer 320. Such structural features may be provided because the first wavelength conversion layer 320 is formed by dispensing a certain amount of a transparent resin mixed with the first wavelength conversion material 320a and having fluidity.

Figure 16:
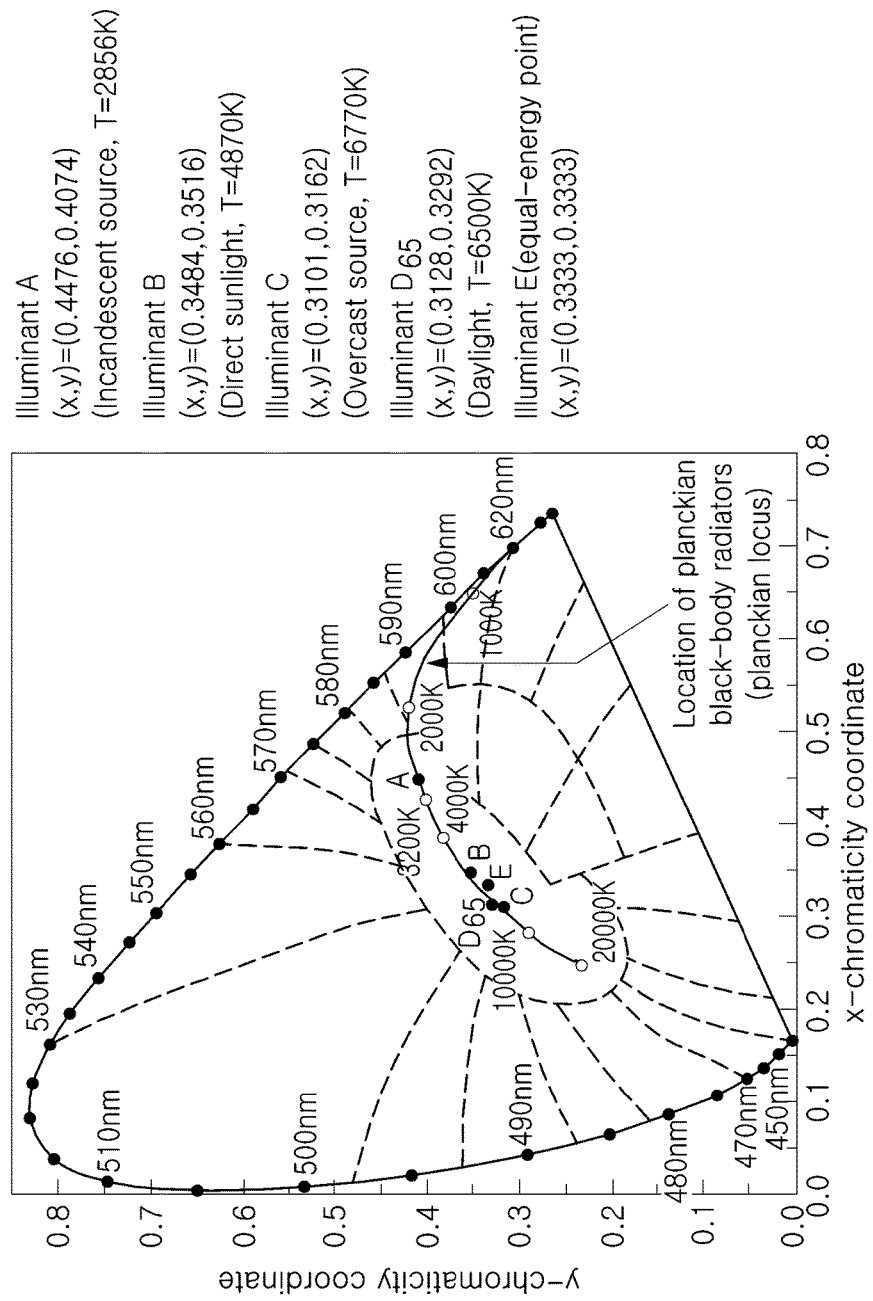
FIG. 16 is a CIE 1931 color space chromaticity diagram illustrating a wavelength conversion material employable in an LED package according to an example embodiment.

FIG. 16 is a CIE 1931 color space chromaticity diagram illustrating a wavelength conversion material used in an LED package according to the present example embodiment.

White light generated by combining a blue light emitting device with yellow, green, and red phosphors and/or a blue light emitting device with a green light emitting device and a red light emitting device may have two or more peak wavelengths, and as illustrated in FIG. 16, (x, y) coordinates of the CIE 1931 color space chromaticity diagram may be located on segments connecting coordinates: (0.4476, 0.4074), (0.3484, 0.3516), (0.3101, 0.3162), (0.3128, 0.3292), and (0.3333, 0.3333). Alternatively, (x, y) coordinates may be located in an area surrounded by the segments and a blackbody radiation spectrum. A color temperature of the white light may range from 2,000K to 20,000K. In FIG. 16, white light adjacent to Point E (0.3333, 0.3333) below the blackbody radiation spectrum may be used as a light source for lighting to create clearer viewing conditions to a naked eye in a state in which light having a yellow-based component is reduced. Thus, a lighting product using white light in the vicinity of the Point E (0.3333, 0.3333) below the blackbody radiation spectrum may be useful as lighting for a retail space in which consumer goods are sold.

Various types of materials such as a phosphor and a quantum dot may be used as a material converting a wavelength of light emitted by an LED package.

Phosphors may have the following empirical formulas and colors:

Oxides: Yellow and green $Y_3Al_5O_{12}$:Ce, $Tb_3Al_5O_{12}$: Ce, $Lu_3Al_5O_{12}$:Ce Silicates: Yellow and green $(Ba,Sr)_2SiO_4$:Eu, yellow and orange $(Ba,Sr)_3SiO_5$:Ce Nitrides: Green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$, where 0.5≤x≤3, 0<z<0.3, and 0<y≤4 (Here, Ln may be at least one type of element selected from the group consisting of Group IIIa elements and rare earth elements, and M may be at least one type of element selected from the group consisting of calcium (Ca), barium (Ba), strontium (Sr), and magnesium (Mg)).

Fluorides: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$.

A phosphor composition may be required to conform with stoichiometry, and respective elements thereof may be replaced by other elements in each group on the periodic table. For example, Sr may be replaced with Ba, Ca, Mg, and the like of alkaline earth (group II), and Y may be replaced with Tb, Lu, Sc, Gd, and the like of lanthanides. Eu or the like, an activator, may be replaced with Ce, Tb, Pr, Er, Yb, and the like according to required energy levels. An activator may only be applied to the phosphor composition, or an additional sub-activator or the like may be applied to the phosphor composition to modify characteristics thereof.

In particular, a fluoride-based red phosphor may be coated with a fluoride not containing Mn, or may further include an organic coat on a surface of the fluoride-based red phosphor or on a surface of the fluoride-based red phosphor coated with a fluoride not containing Mn, in order to improve reliability at high temperatures and high humidity. In the case of the fluoride-based red phosphor described above, because a narrow full width at half maximum (FWHM) less than or equal to 40 nm may be implemented unlike other phosphors, the fluoride-based red phosphor may be used for a high-resolution television such as an ultra-high-definition (UHD) television.

Table 1 below indicates types of phosphor for application fields of white light emitting devices using a blue LED chip (440 nm to 460 nm) and an UV LED chip (380 nm to 430 nm).

TABLE 1

| Use | Phosphor |
| --- | --- |
| LED TV BLU | β-SiAlON:$Eu^{2+}$, (Ca, Sr)$AlSiN_3$:$Eu^{2+}$, $La_3Si_6N_{11}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Lighting | $Lu_3Al_5O_{12}$:$Ce^{3+}$, Ca-α-SiAlON:$Eu^{2+}$, $La_3Si_6N_{11}$:$Ce^{3+}$, (Ca, Sr)$AlSiN_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Side view (Mobile, Laptop PC) | $Lu_3Al_5O_{12}$:$Ce^{3+}$, Ca-α-SiAlON:$Eu^{2+}$, $La_3Si_6N_{11}$:$Ce^{3+}$, (Ca, Sr)$AlSiN_3$:$Eu^{2+}$, $Y_3Al_5O_{12}$:$Ce^{3+}$, (Sr, Ba, Ca, Mg)$_2SiO_4$:$Eu^{2+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Electronic device (Head Lamp, etc.) | $Lu_3Al_5O_{12}$:$Ce^{3+}$, Ca-α-SiAlON:$Eu^{2+}$, $La_3Si_6N_{11}$:$Ce^{3+}$, (Ca, Sr)$AlSiN_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |

In addition, a wavelength converter may be formed using a wavelength conversion material as a quantum dot, which may be used to replace a phosphor or may be mixed with a phosphor. The quantum dot may have a core-shell structure using a group III-V compound semiconductor or a group II-VI compound semiconductor. For example, the quantum dot may have a core such as CdSe or InP, and a shell such as ZnS or ZnSe. The quantum dot may also include a ligand stabilizing the core and the shell.

Figure 17:
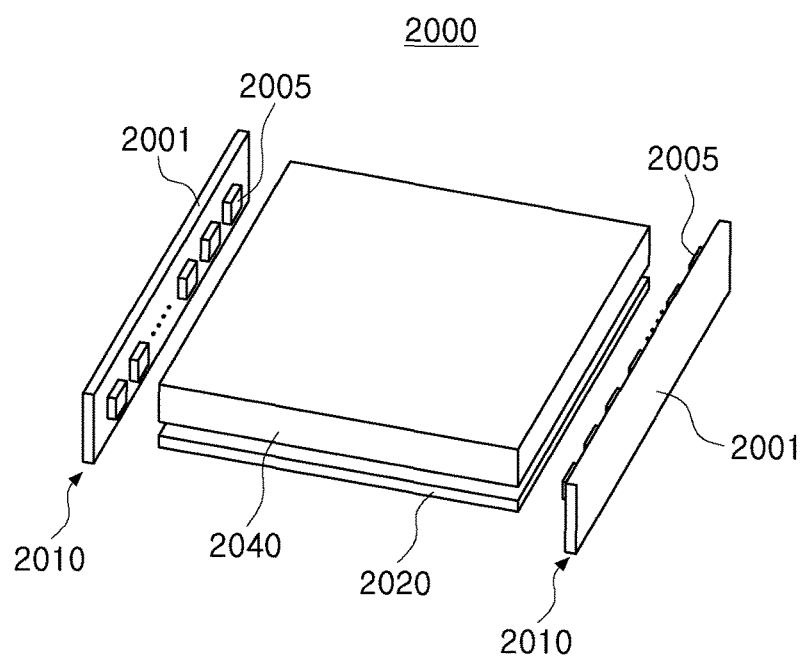
FIG. 17 is a perspective view of a backlight unit including an LED package according to an example embodiment.

FIG. 17 is a perspective view of a backlight unit including an LED package according to an example embodiment.

Referring to FIG. 17, a backlight unit 2000 may include a light guide plate 2040, and light source modules 2010 provided on opposite side surfaces thereof, respectively. The backlight unit 2000 may also further include a reflective plate 2020 disposed below the light guide plate 2040. The backlight unit 2000 may be an edge-type according to an example embodiment.

According to an example embodiment, the light source modules 2010 may be provided only on a side surface of the light guide plate 2040, or additionally on another side surface thereof. Each of the light source modules 2010 may include a printed circuit board (PCB) 2001 and a plurality of light sources 2005 disposed on an upper surface of the PCB 2001. Here, each of the light sources 2005 may include an LED package according to one of the above example embodiments.

Figure 18:
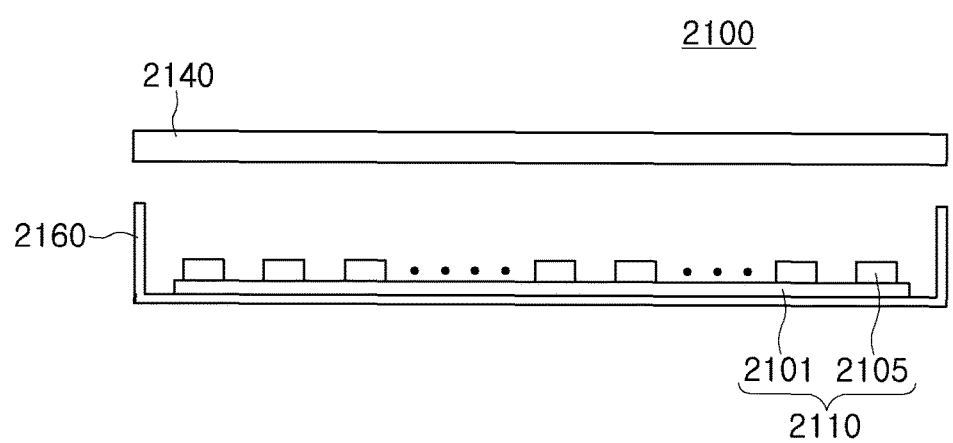
FIG. 18 is a cross-sectional view of a direct-type backlight unit including an LED package according to an example embodiment.

FIG. 18 is a cross-sectional view of a direct-type backlight unit including an LED package according to an example embodiment.

Referring to FIG. 18, a backlight unit 2100 may include a light diffusion plate 2140, and a light source module 2110 disposed below the light diffusion plate 2140. The backlight unit 2100 may also further include a bottom case 2160 disposed below the light diffusion plate 2140 and accommodating the light source module 2110. The backlight unit 2100 may be a direct-type according to an example embodiment.

The light source module 2110 may include a PCB 2101 and a plurality of light sources 2105 disposed on an upper surface of the PCB 2101. Here, each of the light sources 2105 may include an LED package according to one of the above example embodiments.

Figure 19:
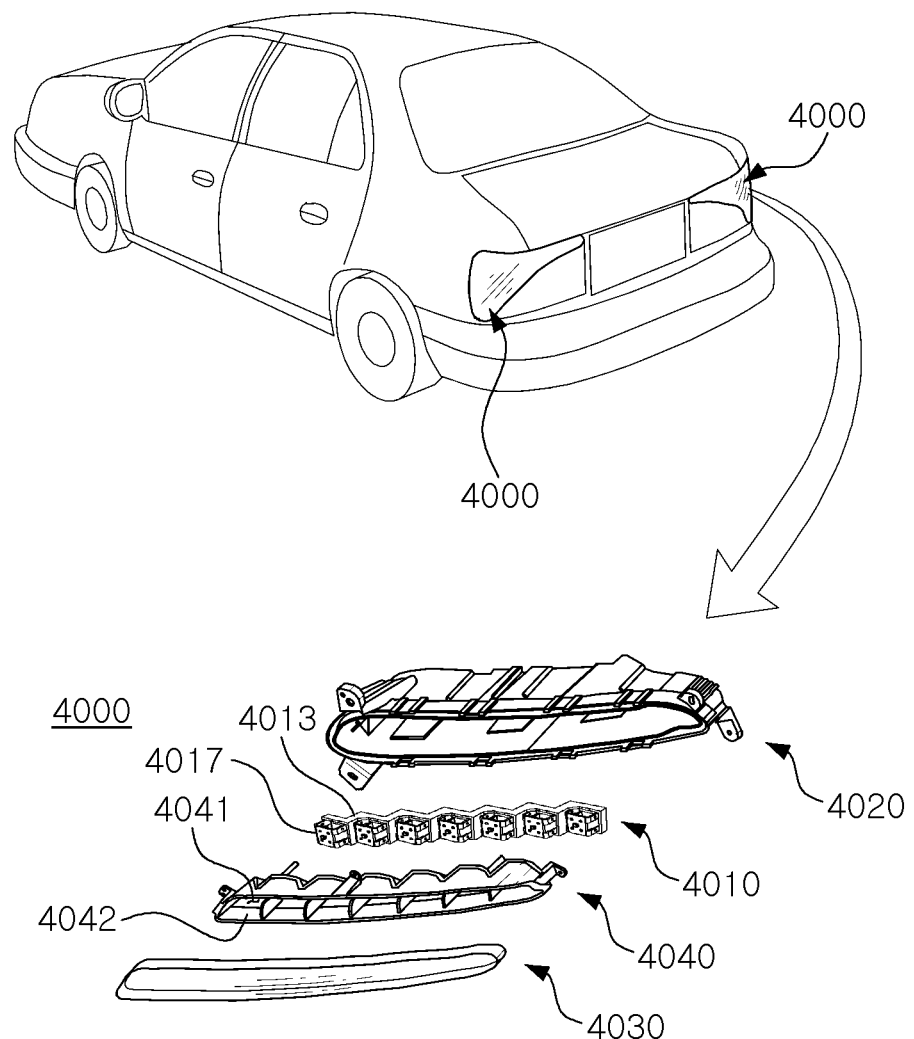
FIG. 19 is a schematic view of a lighting device including an LED package according to an example embodiment.

FIG. 19 is a schematic view of a lighting device in which a light source module according to an example embodiment is adopted. The lighting device may include, for example, rear lamps of a vehicle according to an example embodiment.

Referring to FIG. 19, a lighting device 4000 may include a housing 4020 supporting a light source module 4010, and a cover 4030 covering the housing 4020 to protect the light source module 4010, and a reflector 4040 may be disposed on the light source module 4010. The reflector 4040 may include a plurality of reflective surfaces 4041, and a plurality of through holes 4042 provided on respective bottom surfaces of the plurality of reflective surfaces 4041. A plurality of light emitting units 4017 of the light source module 4010 may be exposed to the reflective surfaces 4041 through the through holes 4042, respectively.

The lighting device 4000 may have an overall gently curved structure to correspond to a shape of a corner portion of a vehicle. Thus, the light emitting unit 4017 may be attached to a frame 4013 to match the curved structure of the lighting device 4000, thereby forming the light source module 4010 having a step structure corresponding to the curved structure. Such a structure of the light source module 4010 may be variously modified depending on designs of the lighting device 4000, for example, the rear lamps. This may also allow the number of light emitting units 4017 attached to be changed.

In the present example embodiment, the lighting device 4000 is exemplified as being the rear lamps of the vehicle, but the inventive concept is not limited thereto. For example, the lighting device 4000 may take a form of a headlamp of a vehicle, and a turn signal lamp mounted in door mirrors of a vehicle. In this case, the light source module 4010 may have a multistep structure corresponding to curved surfaces of the headlamp and the turn signal lamp.

Figure 20:
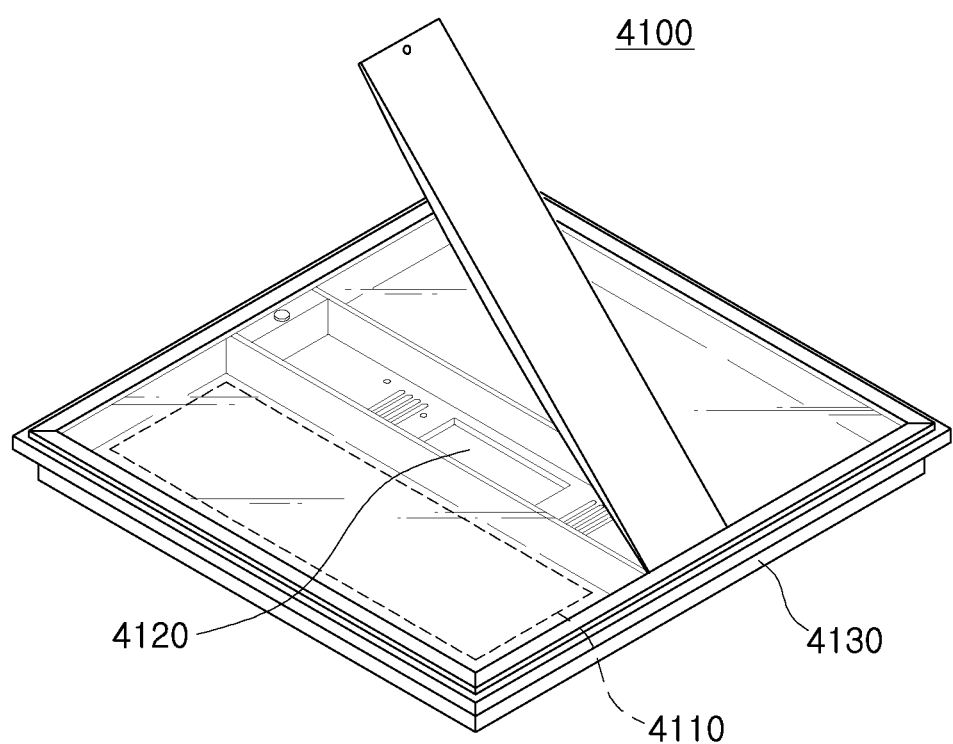
FIG. 20 is a perspective view of a flat panel lighting device including an LED package according to an example embodiment.

FIG. 20 is a perspective view of a flat panel lighting device including an LED package according to an example embodiment.

Referring to FIG. 20, a flat panel lighting device 4100 may include a light source module 4110, a power supply 4120, and a housing 4130. According to an example embodiment, the light source module 4110 may include a light emitting device array as a light source, and the power supply 4120 may include a light emitting device driver.

The light source module 4110 may include the light emitting device array, and may have an overall flat shape. The light emitting device array may include a light emitting device and a controller storing driving information of the light emitting device. The light emitting device may be an LED package according to one of the above example embodiments.

The power supply 4120 may be configured to supply power to the light source module 4110. The housing 4130 may have a space to receive the light source module 4110 and the power supply 4120 therein, and may have a hexahedral shape with an open side surface, but is not limited thereto. The light source module 4110 may be disposed to emit light to the open side surface of the housing 4130.

Figure 21:
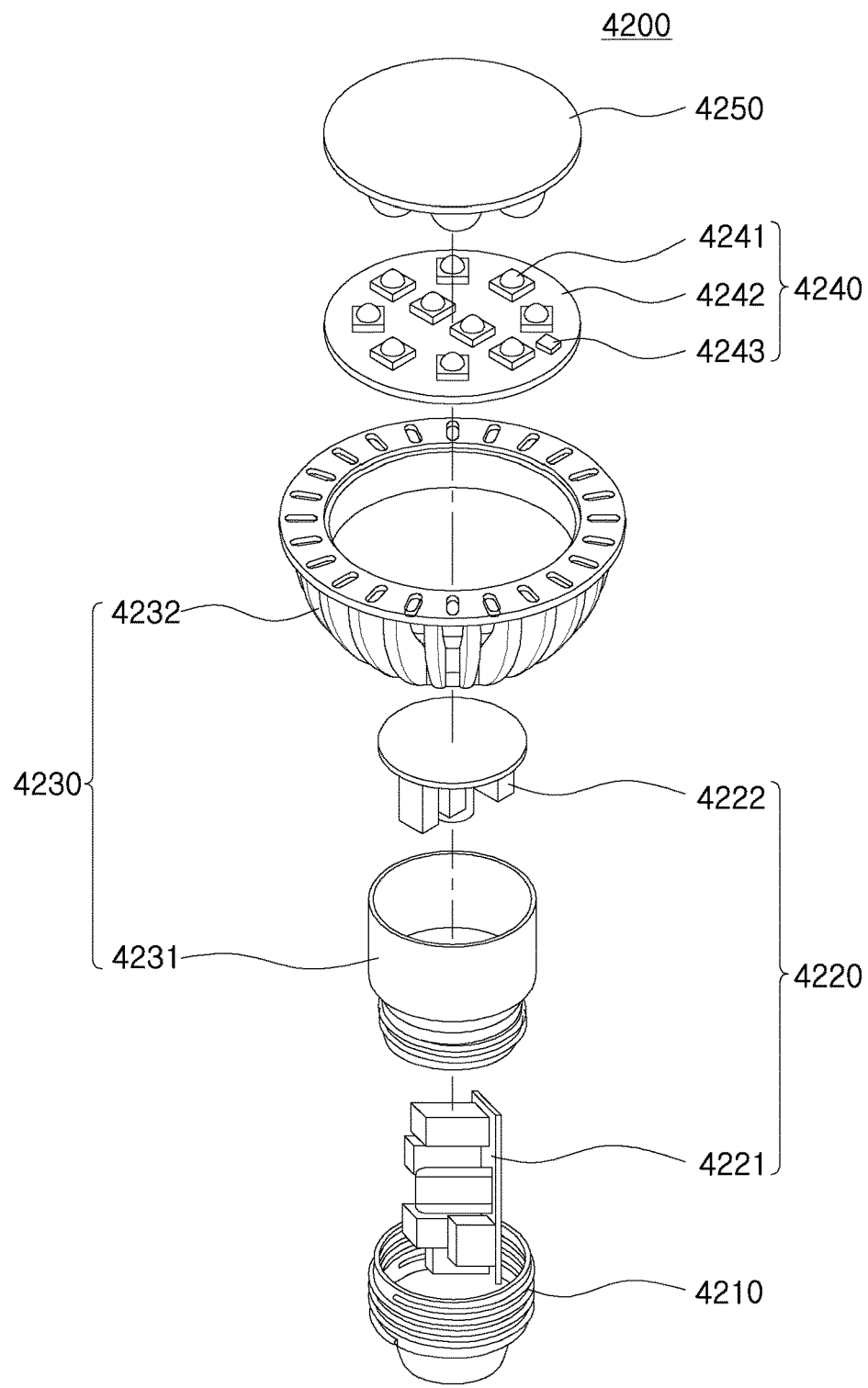
FIG. 21 is an exploded perspective view of a bulb-type lamp including an LED package according to an example embodiment.

FIG. 21 is an exploded perspective view of a lamp including an LED package according to an example embodiment.

Referring to FIG. 21, a lighting device 4200 may include a socket 4210, a power supply 4220, a heat sink 4230, a light source module 4240, and an optical unit 4250. The light source module 4240 may include a light emitting device array, and the power supply 4220 may include a light emitting device driver.

The socket 4210 may be configured to replace that of a related art lighting device. Power supplied to the lighting device 4200 may be applied through the socket 4210. As illustrated in FIG. 21, the power supply 4220 may be separately attached with a first power supply 4221 and a second power supply 4222. The heat sink 4230 may include an internal heat sink 4231 and an external heat sink 4232. The internal heat sink 4231 may be directly connected to the light source module 4240 and/or the power supply 4220. This may allow heat to be transferred to the external heat sink 4232. The optical unit 4250 may include an internal optical portion (not shown) and an external optical portion (not shown), and may be configured to evenly scatter light emitted by the light source module 4240.

The light source module 4240 may receive power from the power supply 4220 to emit light to the optical unit 4250. The light source module 4240 may include at least one light emitting device 4241, a circuit board 4242, and a controller 4243, and the controller 4243 may store driving information of the at least one light emitting device 4241. The at least one light emitting device 4241 may be an LED package according to one of the above example embodiments.

Figure 22:
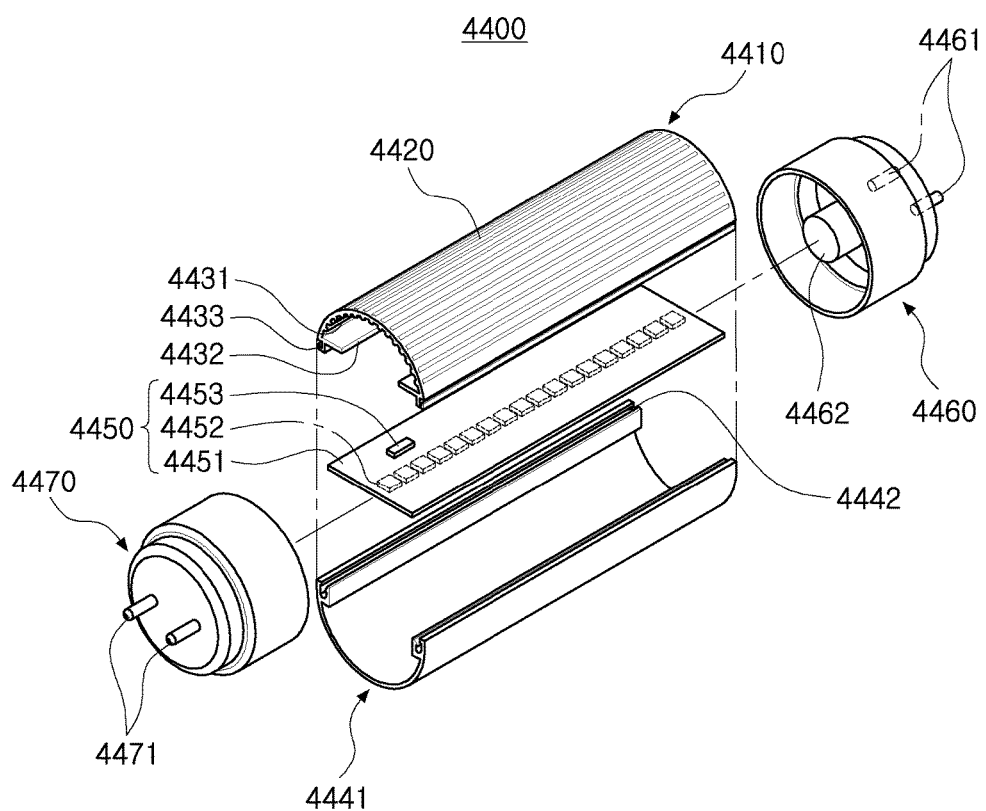
FIG. 22 is an exploded perspective view of a bar-type lamp including an LED package according to an example embodiment.

FIG. 22 is an exploded perspective view of a bar-type lamp including an LED package according to an example embodiment.

Referring to FIG. 22, a lighting device 4400 may include a heat sink 4410, a cover 4441, a light source module 4450, a first socket 4460 and a second socket 4470. A plurality of heat sink fins 4420 and 4431 may have an uneven shape on internal or/and external surfaces of the heat sink 4410, and may be designed to have various shapes and intervals. The heat sink 4410 may have protruding supports 4432 respectively formed on insides thereof. The protruding supports 4432 may be fixed to the light source module 4450. The heat sink 4410 may have protrusions 4433 respectively formed on opposing ends thereof.

The cover 4441 may have grooves 4442 formed therein, and the protrusions 4433 of the heat sink 4410 may be coupled to the grooves 4442 by a hook coupling structure, respectively. Locations of the grooves 4442 and the protrusions 4433 may be reversed with each other.

The light source module 4450 may include a light emitting device array. The light source module 4450 may include a PCB 4451, light sources 4452, and a controller 4453. The controller 4453 may store driving information of the light sources 4452. The PCB 4451 may have circuit lines formed thereon to operate the light sources 4452. The PCB 4451 may also include components operating the light sources 4452. Each of the light sources 4452 may include an LED package according to one of the above example embodiments.

The first and second sockets 4460 and 4470 may have a structure coupled to both ends of a cylindrical cover unit including the heat sink 4410 and the cover 4441 as a pair of sockets. For example, the first socket 4460 may include electrode terminals 4461 and a power supply 4462, and the second socket 4470 may include dummy terminals 4471 disposed thereon. In addition, one of the first and second sockets 4460 and 4470 may have an optical sensor and/or a communications module built therein. For example, the second socket 4470 with the dummy terminals 4471 disposed thereon may have an optical sensor and/or a communications module built therein. As another example, the first socket 4460 with the electrode terminals 4461 disposed thereon may have an optical sensor and/or a communications module built therein.

Figure 23:
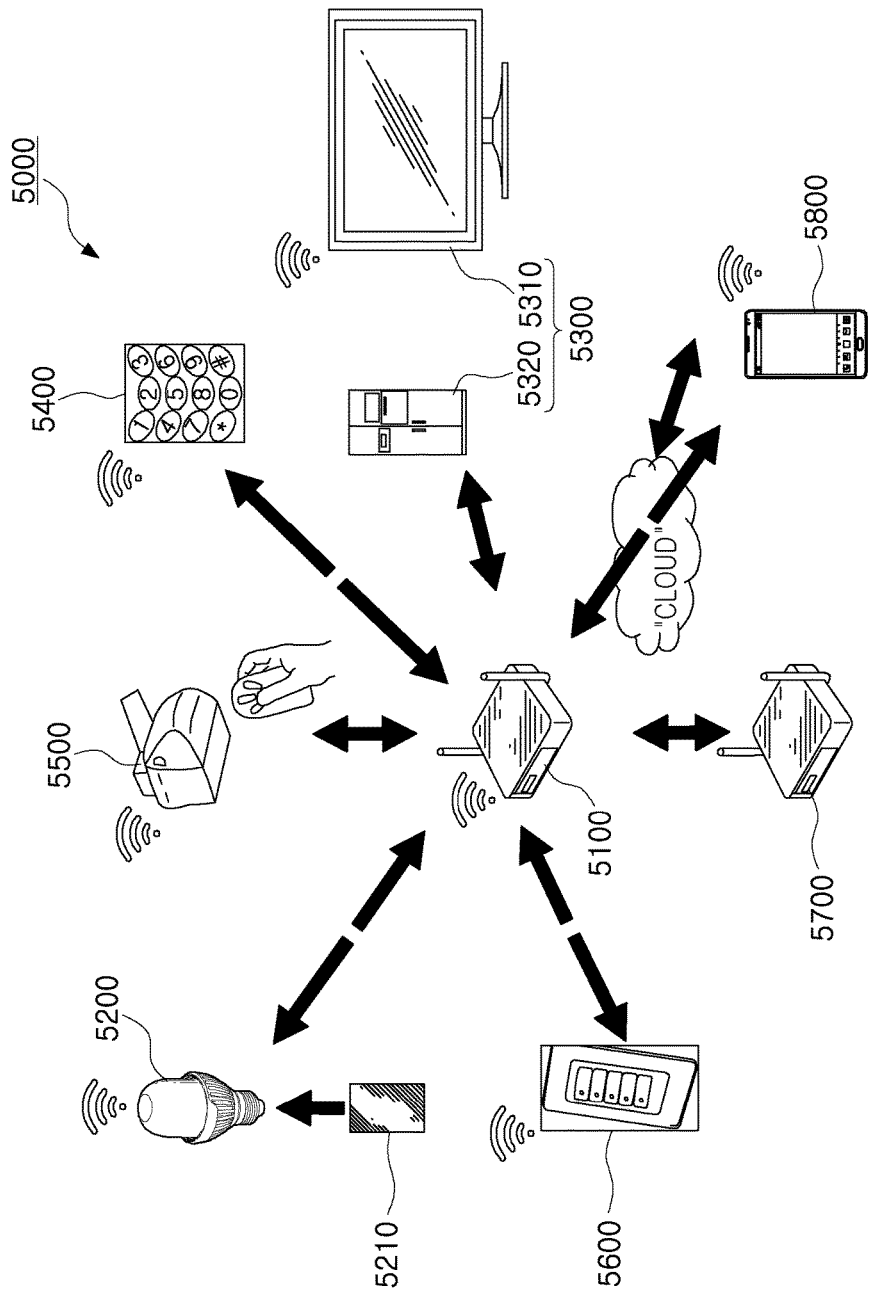
FIG. 23 is a schematic view of an indoor lighting control network system including an LED package according to an example embodiment.

FIG. 23 is a schematic view of an indoor lighting control network system including an LED package according to an example embodiment.

Referring to FIG. 23, a network system 5000 according to an example embodiment may be a complex smart lighting-network system in which lighting technology, Internet of Things (IoT) technology, wireless communications technology, and the like, using a light emitting device such as an LED, converge. The network system 5000 may be implemented using various types of lighting devices and wired and wireless communications devices, and may be realized by a sensor, a controller, a communications unit, software for network control and maintenance, and the like.

The network system 5000 may be applied to an open space such as a park or a street, as well as a closed space defined within a building, such as a home or an office. The network system 5000 may be implemented on the basis of an Internet of Things (IoT) environment to collect and process various pieces of information and provide the collected and processed information to a user. At this time, an LED lamp 5200 included in the network system 5000 may function to check and control operational states of other devices 5300 to 5800 included in the IoT environment on the basis of a function of the LED lamp 5200 such as visible light communications, as well as to receive information regarding surroundings from a gateway 5100 to control lighting of the LED lamp 5200 itself.

Referring to FIG. 23, the network system 5000 may include the gateway 5100 processing data transmitted and received according to different communications protocols, the LED lamp 5200 connected to the gateway 5100 to communicate therewith and including an LED, and the plurality of devices 5300 to 5800 connected to the gateway 5100 to communicate therewith according to various wireless communications schemes. In order to implement the network system 5000 on the basis of the IoT environment, the respective devices 5300 to 5800 including the LED lamp 5200 may include at least one communications module. According to an example embodiment, the LED lamp 5200 may be connected to the gateway 5100 to communicate therewith by wireless communications protocols such as Wi-Fi, Zigbee®, and light fidelity (Li-Fi). To this end, the LED lamp 5200 may have at least one communications module 5210 for a lamp. The LED lamp 5200 may include an LED package according to one of the above example embodiments.

As described above, the network system 5000 may be applied to an open space such as a park or a street, as well as a closed space such as a home or an office. When the network system 5000 is applied to a home, the plurality of devices 5300 to 5800 included in the network system 5000 and connected to the gateway 5100 to communicate therewith on the basis of IoT technology may include home appliances 5300 such as a television 5310 or a refrigerator 5320, a digital door lock 5400, a garage door lock 5500, a lighting switch 5600 installed on a wall or the like, a router 5700 for wireless network relay, and a mobile device 5800 such as a smartphone, a tablet PC, or a laptop personal computer (PC).

In the network system 5000, the LED lamp 5200 may check the operational states of the various devices 5300 to 5800 or automatically control luminance of the LED lamp 5200 itself according to surroundings and circumstances using wireless communications networks (Zigbee®, Wi-Fi, Li-Fi, and the like) installed in a home. Using Li-Fi communications using visible light emitted by the LED lamp 5200 may allow the devices 5300 to 5800 included in the network system 5000 to be controlled.

First, the LED lamp 5200 may automatically control the luminance of the LED lamp 5200 on the basis of surrounding information transmitted from the gateway 5100 through the communications module for the lamp 5210, or surrounding information collected by a sensor mounted to the LED lamp 5200. For example, brightness of the LED lamp 5200 may be automatically controlled according to a type of a program being broadcast on the television 5310 or brightness of an image. To this end, the LED lamp 5200 may receive operation information of the television 5310 from the communications module for the lamp 5210 connected to the gateway 5100. The communications module for a lamp 5210 may be integrally modularized with a sensor and/or a controller included in the LED lamp 5200.

For example, in a case in which a program broadcast on TV is a drama, a color temperature of illumination may be controlled to be less than or equal to 12,000K, such as 5,000K according to predetermined settings to control colors, thereby creating a cozy atmosphere. In a different manner, when a program is a comedy, the network system 5000 may be configured in such a manner that a color temperature of illumination is increased to 5,000K or more and to be blue-based white lighting according to predetermined settings.

When a certain period of time passes after the digital door lock 5400 is locked while there is no person in a home, the network system 5000 may allow all LED lamps 5200 turned on to be turned off, thereby preventing a waste of electricity. Alternatively, when a security mode is set by the mobile device 5800 or the like, if the digital door lock 5400 is locked while there is no person in a home, the network system 5000 may allow the LED lamps 5200 to be kept turned on.

Operations of the LED lamp 5200 may also be controlled according to surrounding information collected by various types of sensors connected to the network system 5000. For example, when the network system 5000 is implemented in a building, a light, a position sensor, and a communications module may be combined with each other in the building to collect information on locations of people in the building so that the light may be turned on or off, or the collected information may be provided to a user in real time, thereby enabling facility management or efficient use of an idle space. In general, since a lighting device such as the LED lamp 5200 is disposed in almost all of the spaces on each floor of a building, various pieces of information in the building may be collected by a sensor integrated with the LED lamp 5200, and the collected information may be used to manage facilities or utilize an idle space.

Meanwhile, a combination of the LED lamp 5200 with an image sensor, a storage device, the communications module for the lamp 5210, and the like may allow the LED lamp 5200 to be utilized as a device that may maintain building security or detect and deal with an emergency. For example, when a smoke or temperature sensor is attached to the LED lamp 5200, the LED lamp 5200 may quickly detect whether a fire or the like occurs, thereby significantly reducing damage, and may also control the brightness of lighting considering external weather or an amount of sunshine, thereby saving energy and providing a comfortable lighting environment.

Figure 24:
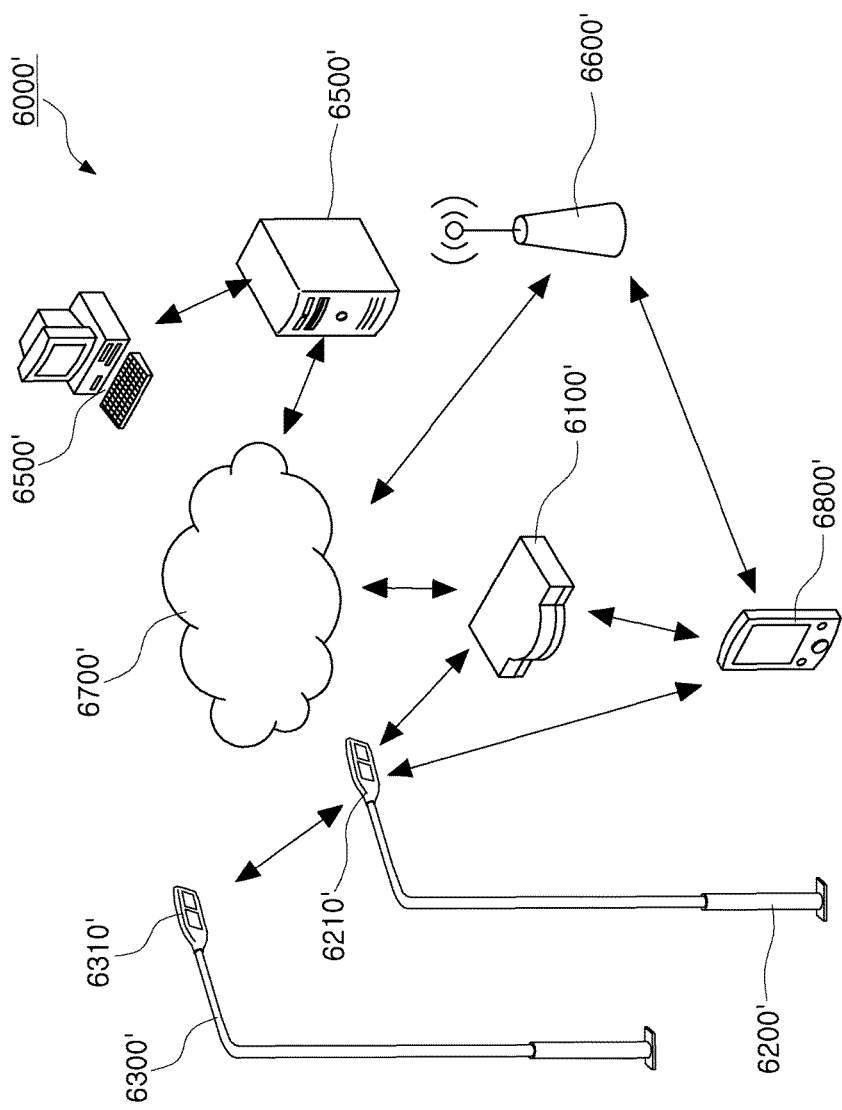
FIG. 24 is a schematic view of an open network system including an LED package according to an example embodiment.

FIG. 24 is a schematic view of an open network system including an LED package according to an example embodiment.

Referring to FIG. 24, a network system 6000' according to an example embodiment may include a communications connection device 6100', a plurality of lighting fixtures 6200' and 6300' installed at predetermined intervals and connected to the communications connection device 6100' to communicate therewith, a server 6400', a computer 6500' managing the server 6400', a communications base station 6600', a communications network 6700' connecting the above-mentioned communicable devices, a mobile device 6800', and the like.

The plurality of lighting fixtures 6200' and 6300' installed in an external open space such as a street or a park may include smart engines 6210' and 6310', respectively. Each of the smart engines 6210' and 6310' may include a sensor collecting information regarding surroundings, a communications module, and the like, in addition to a light emitting device emitting light and a driver driving the light emitting device. The communications module may allow the smart engines 6210' and 6310' to communicate with other surrounding devices according to communications protocols such as Wi-Fi, Zigbee®, and Li-Fi As an example, one smart engine 6210' may be connected to the other smart engine 6310' to communicate therewith. In this case, Wi-Fi extension technology (Wi-Fi mesh) may be applied to communications between the smart engines 6210' and 6310'. At least one smart engine 6210' may be connected to the communications connection device 6100' linked to the communications network 6700' through wired and wireless communications. In order to increase communications efficiency, several smart engines 6210' and 6310' may be grouped into one to be connected to a single communications connection device 6100'.

The communications connection device 6100' may relay communications between the communications network 6700' and other devices, as an access point (AP) that enables wired and wireless communications. The communications connection device 6100' may be connected to the communications network 6700' by at least one wired and wireless communications method, and may be mechanically accommodated in one of the lighting fixtures 6200' and 6300' as an example.

The communications connection device 6100' may be connected to the mobile device 6800' using a communications protocol such as Wi-Fi. A user of the mobile device 6800' may receive information regarding surroundings collected by the plurality of smart engines 6210' and 6310' through the communications connection device 6100' connected to the smart engine 6210' of an adjacent surrounding lighting fixture 6200'. The information regarding the surroundings may include surrounding traffic information, weather information, and the like. The mobile device 6800' may be connected to the communications network 6700' by a wireless cellular communications method such as 3G or 4G through the communications base station 6600'.

Meanwhile, the server 6400' connected to the communications network 6700' may monitor operational states or the like of the respective lighting fixtures 6200' and 6300' while receiving information collected by the smart engines 6210' and 6310' respectively mounted in the lighting fixtures 6200' and 6300'. In order to manage the respective lighting fixtures 6200' and 6300' on the basis of the monitoring results of the operational states of the respective lighting fixtures 6200' and 6300', the server 6400' may be connected to the computer 6500' providing a management system. The computer 6500' may execute software or the like able to monitor and manage operational states of the respective lighting fixtures 6200' and 6300', particularly the smart engines 6210' and 6310'.

Figure 25:
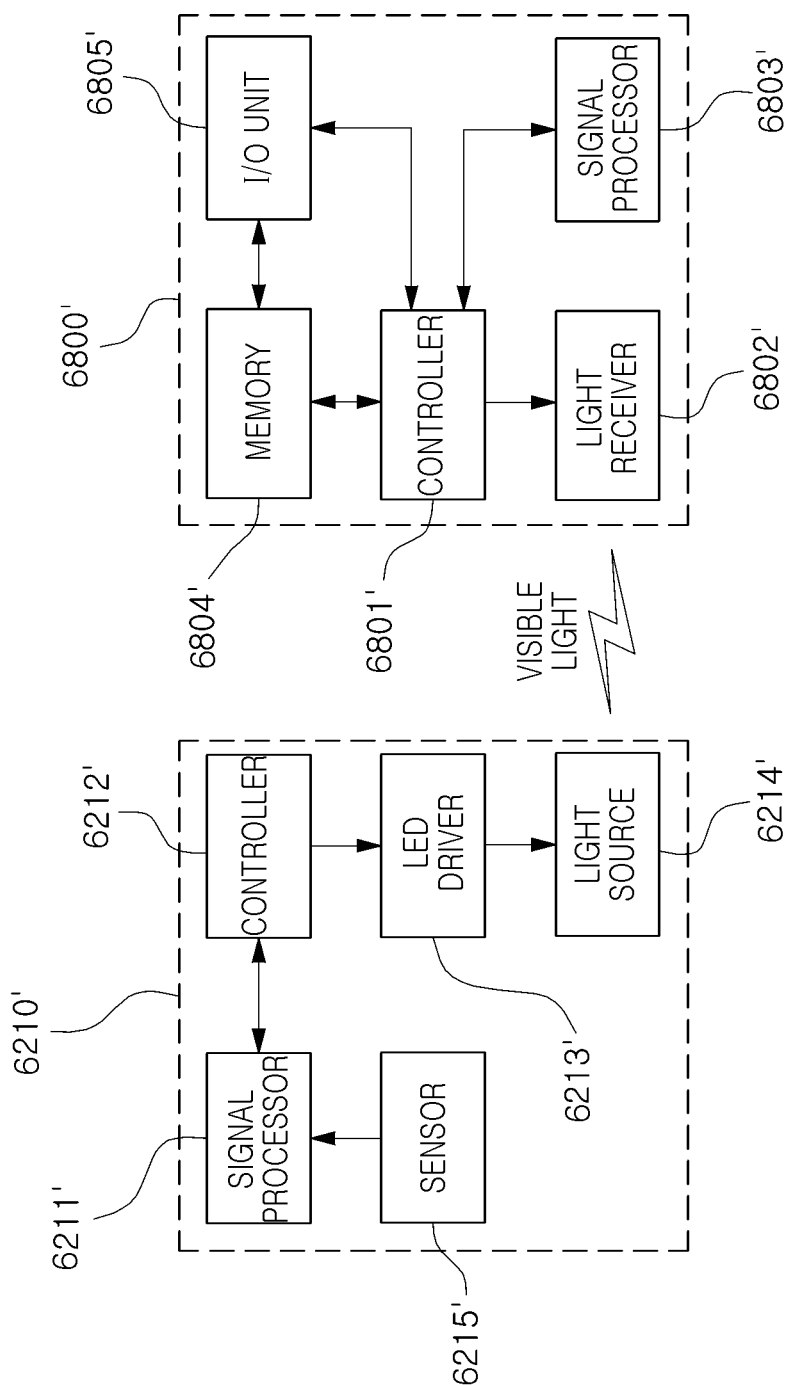
FIG. 25 is a block diagram illustrating communications operations between a smart engine of a lighting device and a mobile device through visible light communications including an LED package according to an example embodiment.

FIG. 25 is a block diagram illustrating communications operations between a smart engine of a lighting device and a mobile device through visible light communications including an LED package according to an example embodiment.

Referring to FIG. 25, a smart engine 6210' may include a signal processor 6211', a controller 6212', an LED driver 6213', a light source 6214', a sensor 6215', and the like. A mobile device 6800' connected to the smart engine 6210' through visible light communications may include a controller 6801', a light receiver 6802', a signal processor 6803', a memory 6804', an input/output (I/O) unit 6805', and the like. The light source 6214' may include an LED package according to an example embodiment described above.

Visible light communications technology, Li-Fi, may be used to wirelessly transmit information using light in the visible spectrum that can be recognized by human eyes. Such visible light communications technology may be distinguished from related art wired optical communications technology and wireless infrared light communications in terms of using light in a visible spectrum, that is, a certain visible light frequency from an LED package described in the above example embodiments, and may be differentiated from wired optical communications technology in terms of a wireless communications environment. The visible light communications technology may also be convenient in that the visible light communications technology may be freely used without being restricted or permitted in terms of use of frequency, unlike radio frequency (RF) wireless communications, may be distinctive in that physical security is excellent and a user may be able to see a communications link with the naked eye, and principally, may have a characteristic of convergence technology that obtains both a unique purpose as a light source and a communications function.

The signal processor 6211' of the smart engine 6210' may process data that is desired to be transmitted and received by visible light communications. As an example, the signal processor 6211' may process information collected by the sensor 6215' into data and transmit the data to the controller 6212'. The controller 6212' may control operations of the signal processor 6211', the LED driver 6213', and the like, and in particular, may control operations of the LED driver 6213' on the basis of data transmitted from the signal processor 6211'. The LED driver 6213' may transmit data to the mobile device 6800' by allowing the light source 6214' to emit light in response to a control signal transmitted from the controller 6212'.

The mobile device 6800' may include the light receiver 6802' recognizing visible light including data in addition to the controller 6801', the memory 6804' storing data, the I/O unit 6805' including a display, a touchscreen, an audio output unit, and the like, and the signal processor 6803'. The light receiver 6802' may detect visible light and convert the detected visible light into an electrical signal, and the signal processor 6803' may decode data included in the electrical signal converted by the light receiver 4802'. The controller 6801' may store the data decoded by the signal processor 6803' to the memory 6804' or output the decoded data through the I/O unit 6805' or the like in such a manner that a user may recognize the decoded data.

As set forth above, according to various example embodiments, an LED package that may allow luminous flux thereof to be increased and CRI thereof to be improved may be provided.

While example embodiments have been shown and described above, it will be apparent to those skilled in the art that modifications and variations could be made without departing from the scope of the inventive concept as defined by the appended claims.

What is claimed is:

1. A light emitting diode (LED) package comprising:
a package body;
an LED chip mounted above the package body, the LED chip comprising a light emitting structure and a substrate disposed on the light emitting structure and having a size equal to a size of the light emitting structure;
a first wavelength conversion layer containing a first wavelength conversion material, and comprising:
an upper surface portion disposed directly on a part of an upper surface of the substrate of the LED chip; and
a lateral portion disposed on four side surfaces of the LED chip; and
a second wavelength conversion layer containing a second wavelength conversion material different from the first wavelength conversion material,
wherein the second wavelength conversion layer is disposed on the first wavelength conversion layer, and is disposed directly on a remaining part of the upper surface of the substrate of the LED chip.

2. The LED package of claim 1, wherein the lateral portion of the first wavelength conversion layer has a concavely inclined surface extending outwardly from upper edges of the LED chip to a portion of the package body.

3. The LED package of claim 1, wherein the upper surface portion of the first wavelength conversion layer is disposed on only two upper vertexes, among a plurality of upper vertexes, of the LED chip opposite to each other in a diagonal direction.

4. The LED package of claim 1, wherein the upper surface portion of the first wavelength conversion layer is not disposed on portions of two upper edges, among a plurality of upper edges, of the LED chip opposite to each other.

5. The LED package of claim 1, wherein the upper surface portion of the first wavelength conversion layer has different thicknesses of which the greatest thickness is within a range of 10 µm to 40 µm.

6. The LED package of claim 1, wherein an area of the upper surface portion of the first wavelength conversion layer is within a range of 85% to 95% of an area of the upper surface of the LED chip.

7. The LED package of claim 1, wherein the first wavelength conversion layer further comprises a transparent resin, and an edge part of the lateral portion of the first wavelength conversion layer comprises a region including only the transparent resin among the transparent resin and the first wavelength conversion material.

8. The LED package of claim 1, wherein the LED chip is mounted above the package body in a flip-chip form, and the first wavelength conversion layer fills a space between a lower surface of the LED chip and the package body.

9. The LED package of claim 1, further comprising a reflective structure disposed above the package body,
wherein the reflective structure is inclined to reflect a light emitted from the second wavelength conversion layer in an upward direction, and
wherein the lateral portion of the first wavelength conversion layer has a concavely inclined surface extending outwardly from upper edges of the LED chip to a portion of the package body without contacting the reflective structure.

10. The LED package of claim 1, wherein the LED chip is configured to emit a blue light, and
wherein the first wavelength conversion material contains a red phosphor, and the second wavelength conversion material contains a green phosphor.

11. A light emitting diode (LED) package comprising:
a package body;
an LED chip mounted above the package body, the LED chip comprising a light emitting structure and a substrate disposed on the light emitting structure and having a size equal to a size of the light emitting structure;
a first wavelength conversion layer containing a first wavelength conversion material, being disposed on at least side surfaces of the LED chip, and having a concavely inclined surface extending outwardly from upper edges of the side surfaces of the LED chip to a portion of the package body to be disposed on the side surfaces of the LED chip; and
a second wavelength conversion layer containing a second wavelength conversion material different from the first wavelength conversion material, and being disposed on the first wavelength conversion layer,
wherein the second wavelength conversion layer contacts the at least a part of an upper surface of the substrate of the LED chip, and
wherein the first wavelength conversion layer is directly disposed on a part of an upper surface of the substrate of the LED.

12. The LED package of claim 11,
wherein the first wavelength conversion layer is disposed on only a part of an upper surface of the LED chip, and
wherein the second wavelength conversion layer is disposed on a remaining part of the upper surface of the LED chip.

13. A light emitting diode (LED) package comprising:
a package body;
an LED chip mounted above the package body, the LED chip comprising a light emitting structure and a substrate disposed on the light emitting structure and having a size equal to a size of the light emitting structure;
a first wavelength conversion layer formed by dispensing a first resin containing a first wavelength conversion material over at least a part of an upper surface of the substrate of the LED chip such that the first resin is disposed directly on only a part of an upper surface of the substrate of the LED chip and entire side surfaces of the LED chip; and
a second wavelength conversion layer containing a second wavelength conversion material different from the first wavelength conversion material,
wherein the second wavelength conversion layer is disposed on the first wavelength conversion layer, and is disposed directly on a remaining part of the upper surface of the substrate of the LED chip.

14. The LED package of claim 13, wherein the second wavelength conversion layer is formed by dispensing a second resin containing the second wavelength conversion material over the remaining part of the upper surface of the LED chip and the first wavelength conversion layer.

15. The LED package of claim 13, wherein the second wavelength conversion layer is formed by molding the remaining part of the upper surface of the LED chip and the first wavelength conversion layer using a second resin containing the second wavelength conversion material.

16. The LED package of claim 13, wherein the first wavelength conversion layer is formed by dispensing the first resin over two points of the upper surface of the LED chip opposite to each other in a diagonal direction.

17. The LED package of claim 13, wherein the first wavelength conversion layer comprises a lateral portion having a concavely inclined surface extending outwardly from upper edges of the LED chip to a portion of the package body.

18. The LED package of claim 13, wherein the first resin fills a space between a lower surface of the LED chip and the package body.

* * * * *